(12) United States Patent
Iwanishi

(10) Patent No.: US 7,107,557 B2
(45) Date of Patent: Sep. 12, 2006

(54) METHOD FOR CALCULATION OF CELL DELAY TIME AND METHOD FOR LAYOUT OPTIMIZATION OF SEMICONDUCTOR INTEGRATED CIRCUIT

(75) Inventor: Nobufusa Iwanishi, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 651 days.

(21) Appl. No.: 10/403,285

(22) Filed: Apr. 1, 2003

(65) Prior Publication Data

US 2003/0204828 A1    Oct. 30, 2003

Related U.S. Application Data

(62) Division of application No. 09/714,095, filed on Nov. 17, 2000, now Pat. No. 6,718,529.

(30) Foreign Application Priority Data

Nov. 19, 1999    (JP) ................................. 11-329473

(51) Int. Cl.
  *G06F 17/50*    (2006.01)
  *G06F 9/45*     (2006.01)
(52) U.S. Cl. .................... 716/6; 716/2; 716/3
(58) Field of Classification Search .......... 716/6, 716/2, 3; 326/121
See application file for complete search history.

(56) References Cited

U.S. PATENT DOCUMENTS

| | | | | |
|---|---|---|---|---|
| 6,028,995 A | * | 2/2000 | Jetton et al. .................. 703/19 |
| 6,047,247 A | * | 4/2000 | Iwanishi et al. ............ 702/117 |
| 6,182,269 B1 | * | 1/2001 | Laubhan ........................ 716/5 |
| 6,249,901 B1 | * | 6/2001 | Yuan et al. .................... 716/5 |
| 6,301,689 B1 | * | 10/2001 | Darden ......................... 716/5 |
| 6,397,170 B1 | * | 5/2002 | Dean et al. ................... 703/14 |
| 6,498,515 B1 | * | 12/2002 | Kawakami et al. ......... 326/121 |
| 6,629,299 B1 | * | 9/2003 | Iwanishi ....................... 716/6 |

OTHER PUBLICATIONS

"Method of Estimating Gate Delay for High-frequency CMOS Circuits Using Laplace Transform Solution", I. Kono et al., DA Symposium '97, Jul. 1997, pp. 185-190.

* cited by examiner

*Primary Examiner*—Sun James Lin
(74) *Attorney, Agent, or Firm*—McDermott Will & Emery LLP

(57) ABSTRACT

In a circuit simulation step, a cell transistor level net list is input, the slew of an input signal waveform and the magnitude of a load capacitance connected to a cell output terminal are varied for each cell, to perform a circuit simulation of each cell for obtaining an output signal waveform. Next, in a dependence table generation step, the dependence of the output signal waveform slew upon the input slew rate and the load capacitance is calculated for each cell, the dependence thus calculated is compared with a predetermined threshold level, and according to the dependence level, a delay calculation expression with consideration taken to the delay of signal propagation between the cell input and output terminals and another without such consideration are selectively used. Accordingly, the delay times of the cells forming a semiconductor integrated circuit can be calculated at high accuracy and at high processing speed.

2 Claims, 17 Drawing Sheets

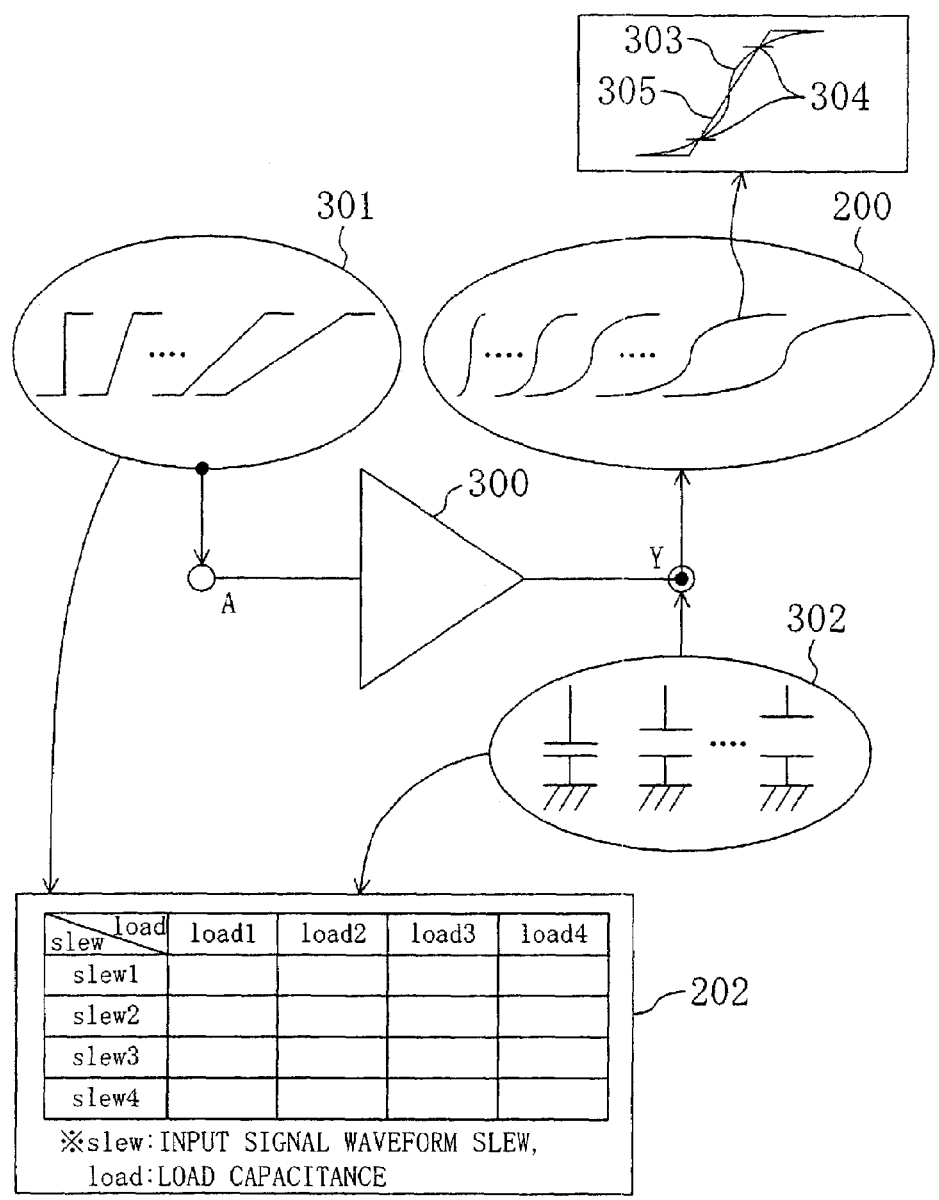

FIG. 4(a)

| slew \ load | load1 | load2 | load3 | load4 |
|---|---|---|---|---|
| slew1 | slew_11 | slew_12 | slew_13 | slew_14 |
| slew2 | slew_21 | slew_22 | slew_23 | slew_24 |
| slew3 | slew_31 | slew_32 | slew_33 | slew_34 |
| slew4 | slew_41 | slew_42 | slew_43 | slew_44 |

| slew \ load | load1 | load2 | load3 | load4 |
|---|---|---|---|---|
| slew1 |  | val_1_12 | val_1_23 | val_1_34 |
| slew2 |  | val_2_12 | val_2_23 | val_2_34 |
| slew3 |  | val_3_12 | val_3_23 | val_3_34 |
| slew4 |  | val_4_12 | val_4_23 | val_4_34 |

| slew \ load | load1 | load2 | load3 | load4 |
|---|---|---|---|---|
| slew1 |  |  |  |  |
| slew2 | val_12_1 | val_12_2 | val_12_3 | val_12_4 |
| slew3 | val_23_1 | val_23_2 | val_23_3 | val_23_4 |
| slew4 | val_34_1 | val_34_2 | val_34_3 | val_34_4 |

| slew \ load | 10fF | 50fF | 100fF | 300fF |
|---|---|---|---|---|
| 1ns | 0.211ns | 0.349ns | 1.157ns | |
| 2ns | 0.191ns | 0.270ns | 1.050ns | |
| 3ns | 0.255ns | 0.304ns | 0.920ns | |
| 4ns | 0.312ns | 0.342ns | 0.904ns | |
| 5ns | 0.362ns | 0.381ns | 0.940ns | |

| slew \ load | 10fF | 50fF | 100fF | 300fF |
|---|---|---|---|---|
| 1ns | 0.211ns | 0.191ns | 0.112ns | 0.005ns |
| 2ns | 0.152ns | 0.220ns | 0.255ns | 0.125ns |
| 3ns | 0.141ns | 0.198ns | 0.235ns | 0.218ns |
| 4ns | 0.132ns | 0.183ns | 0.222ns | 0.258ns |
| 5ns | | | | |

— 501
— 503

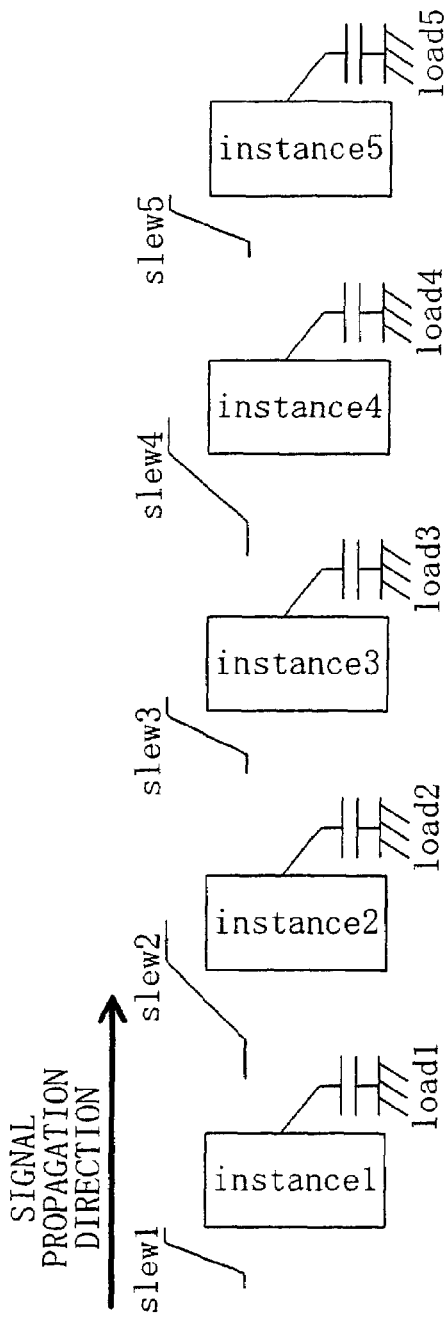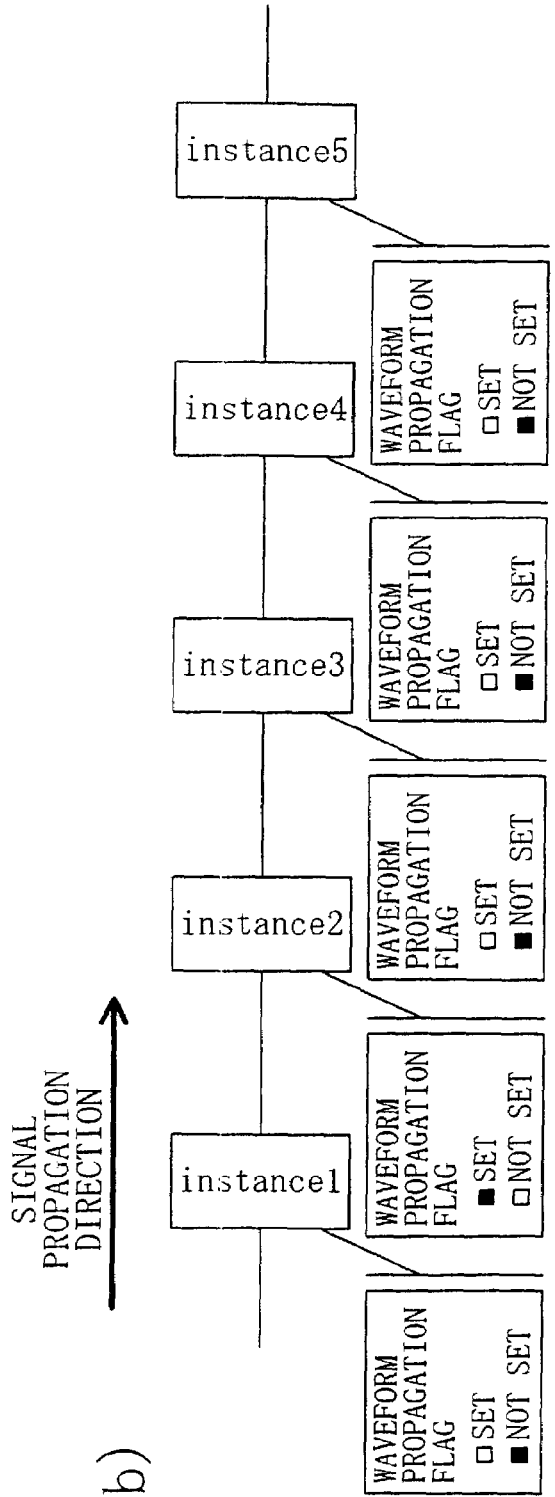
FIG. 9(a)
FIG. 9(b)

METHOD FOR CALCULATION OF CELL DELAY TIME AND METHOD FOR LAYOUT OPTIMIZATION OF SEMICONDUCTOR INTEGRATED CIRCUIT

This application is a divisional of application Ser. No. 09/714,095, filed Nov. 17, 2000 now U.S. Pat. No. 6,718,529.

BACKGROUND OF THE INVENTION

The present invention relates to a delay calculation method and to a layout optimization method for high-accuracy delay time calculation of cells and wires in timing verification during the design of a semiconductor integrated circuit.

Today, because of advances in semiconductor process technology, the size of transistors have been miniaturized and reduced down to less than 0.5 μm (submicron size). Also with respect to rooting of wires, both the wire pitch and the wire width tend toward being shrunk. Therefore, when calculating a length of time taken for a signal to propagate in a large-scale integrated circuit (hereinafter called the "delay time"), it now becomes necessary to pay attention to the influence of the resistance of a wire and the influence of an adjacent wire. These influences have not been taken into much consideration so far.

For the development of high-integration, high-function, high-performance semiconductor LSI circuits, several techniques have been proposed or already put into practice for high-accuracy calculation of the delay time of a wire between cells forming the aforesaid delay time and the delay time of the cells.

Hereinafter, a conventional, post-layout design flow and a cell delay time/wire delay time calculation process procedure will be explained by making reference to FIG. 13. Note that throughout the specification the term "cell" is so defined as to include not only a logical unit such as an inverter and a buffer but also a functional macroblock. Further, the term "instance" is the name for the purpose of identifying cells as different cells even when they have the same logic. This will be explained using a concrete example (FIG. 14). Both an instance 1400 and an instance 1401 are buffer cells. However, in order to deal with these instances as different components, they are named the instance 1400 and the instance 1401.

A conventional design flow and its associated delay calculation method will be described (FIG. 13).

In the layout step S1300 of the design flow (FIG. 13), a delay library 1300 is used to generate a layout 1301 corresponding to a net list 1101. In the layout step S1300, a delay calculation tool mounted in the layout tool is used for timing driven layout in which placement/wire routing is carried out while performing instance and wire delay time calculations. In the timing driven layout, a layout step is carried out according to the timing calculated by the delay calculation tool, which is a possible reason for reduction in returning back to a particular design step due to timing errors of a subsequent design flow. However, when performing a timing driven layout in the layout step S1300, if a delay calculation algorithm different from one used in the delay calculation step S1302 is employed, this causes these two steps to produce different delay calculation results. For this reason, the problem with a layout by the timing driven layout is that the design flow is returned back to a particular design step due to the fact that different delay calculation algorithms produce different delay calculation results.

However, even when both the delay calculation tool and the layout tool employ the same delay calculation algorithm, if the layout step S1300 generates a layout shape that does not allow the delay calculation algorithm to perform delay calculations at high accuracy, this results in poor delay calculation accuracy.

Here, by "the layout shape" is meant the shape of a cell, the drive power of a cell, or the like in a layout. In the timing driven layout, a layout step is carried out while the cell delay time, input slew rate, load capacitance, and wire delay time are calculated from the shape.

Therefore, the layout step S1300 is required to generate a layout having such a layout shape capable of allowing high-accuracy delay calculations in the delay calculation step S1302 for timing error reduction and reduction in returning back to a particular design step due to poor delay calculation accuracy. However, such a measure has not yet been taken so far.

Next, in the RC extraction step S1301, the layout 1301 is input and wire parasitic resistance and capacitance are extracted to generate RC information 1102. This RC information 1102 can be expressed in various formats such as DSPF (Standard Parasitic Format: Cadence Design Systems, "Cadence Standard Parasitic Format", August 1993).

This is followed by the delay calculation step S1302 in which the RC information 1102 and the delay library 1300 are input and the delay times of an instance and a wire in the layout 1301 are calculated and delay information 1302 is output.

Further, in the timing simulation step S1303, while the net list 1101 is collated with the delay information 1302, a timing simulation is carried out to provide a simulation result 1303. The LSI designer looks at the simulation result 1303 and if an timing error is output, then the LSI designer returns back to a necessary design step to redo the design.

As the delay calculation method available in the delay calculation step S1302, there are several types of delay time calculation methods. These delay calculation methods will be explained below.

Whereas one of the delay calculation methods (FIG. 14) does not closely deal with the propagation of a signal waveform, the other delay calculation method (FIG. 16) closely deals with the propagation of a signal waveform.

Each of these delay calculation methods will be described. FIG. 14(*a*) is a conceptual diagram showing a concept relating to the propagation of a waveform for the first delay calculation method. FIG. 14(*b*) is a diagram showing a procedure of the first delay calculation method. FIG. 14(*c*) is a diagram showing the division of the first delay calculation method.

The first delay calculation method of FIG. 14(*a*) is characterized in that the signal waveform propagation between an input and output of a wire 1402 driven by the instance 1400 is calculated and the signal waveform propagation between the input and output terminals of each instance 1400 and 1401 is not taken into consideration.

As more concretely shown in FIG. 14(*b*), in the instance output signal waveform calculation step, giving attention to the fact that the instance 1400 drives the wire 1402 and the instance 1401, a circuit equation at the output terminal of the instance 1400 is set up. Then, the circuit equation is solved thereby to calculate a signal waveform (or an input signal waveform of the wire 1402) 1404 at the output terminal of the instance 1400.

Next, in the wire output signal waveform calculation step, if the signal waveform 1404 is fed to the wire 1402, then a circuit equation at the output of the wire 1402 is set up.

Then, the circuit equation is solved thereby to calculate a signal waveform 1405 at the output of the wire 1402, i.e., an input signal waveform of the instance 1401.

These two steps described above are repeatedly performed on every instance and wire thereby to calculate signal waveforms at the input and output terminals of all the instances for instance delay time calculation and wire delay time calculation.

The algorithm of the first delay calculation method is characterized in that a wire and an instance that is connected to the wire are single split units 1407 and 1408 (see FIG. 14(*c*)). These split units 1407 and 1408 are independent from each other. Accordingly, there is no need to propagate signals in order in the signal propagation direction, therefore producing the advantage of requiring a less length of delay calculation processing time.

However, the first delay calculation method has some problems (FIG. 15). The problems of the first delay calculation method will be described below in detail.

Suppose here that the wire 1402 is several times greater than a wire 1410 in resistance and capacitance. In the already-described first delay calculation method, calculations are performed wherein the split units 1407 and 1408 are independent from each other, so that the output signal waveform 1404 of the instance 1400 which drives the wire 1402 of greater resistance and capacitance becomes dull, while on the other hand the output signal waveform 1406 of the instance 1401 which drives the wire 1410 of smaller resistance and capacitance is calculated as a signal waveform which sharply transits.

However, actually a signal waveform propagates in the signal waveform propagation direction. As a result, the actual output signal waveform of the instance 1401 differs from the output signal waveform 1406 as shown in FIG. 15(*b*). The output signal waveform of the instance 1401 is influenced by the dull output signal waveform 1404 of the instance 1400 and becomes a signal waveform 1500 which is much duller than the aforesaid sharp signal waveform.

As to this point, the results derived from actually-performed circuit simulations are shown in FIG. 17, wherein the wire 1402 has a capacitance of 250 f and a resistance of 500 Ω while the wire 1410 has a capacitance of 5 f and a resistance of 10 Ω and the logic of each instance 1400 and 1401 is an inverter. In FIG. 17, the reference numeral 1700 is a waveform diagram showing a circuit simulation result when signal waveform propagation is taken into consideration and the reference numeral 1701 is another waveform diagram showing a circuit simulation result when signal waveform propagation is not taken into consideration. The reference numeral 1702 is the input signal waveform of the instance 1401. Referring to the waveform diagram 1700 (i.e., the upper waveform diagram in FIG. 17) in which the RC of the wire 1402 connected to the input terminal of the instance 1401 is great, the input signal waveform 1702 of the instance 1401 becomes dull. Such a dull signal waveform propagates through the instance 1401 and is calculated as an output signal waveform 1703. Referring to the waveform diagram 1701 (i.e., the lower waveform diagram in FIG. 17) in which the RC of the wire 1402 connected to the input terminal of the instance 1401 is small, the input signal waveform 1702 of the instance 1401 is sharp. Such a sharp signal waveform propagates through the instance 1401 and is calculated as an output signal waveform 1704. The two output signal waveforms 1703 and 1704 are compared and the result shows that the output signal waveform 1704 is shaper than the output signal waveform 1703. A difference in slew between the two output signal waveforms is calculated and the difference is equivalent to as much as about 40% when a 20% and a 80% value of the supply voltage in each waveform are linearly approximated to serve as a slew. From this, in this conventional delay calculation tool, when a wire that is connected to an output terminal of cell2 is determined, decision is made uniquely, regardless of the input signal waveform. This results in poor delay calculation accuracy.

As described above, the first delay calculation method is not a delay calculation method which performs calculations along the signal propagation direction, in other words the split unit 1407 is first calculated and then the calculation result is used to calculate the split unit 1408. This therefore provides several merits such as eliminating the need for performing path retrieval toward the signal propagation direction, achieving reductions in processing time to reduce the delay calculation processing time. However, there are some demerits. One of the demerits is that the accuracy of delay calculations is poor for circuits with wires whose resistance and capacitance undergo considerable variation, as shown in FIG. 15(*a*).

Next, the second delay calculation method will be described by making reference to FIG. 16.

The delay calculation method or FIG. 16(*a*) is characterized in that both the signal waveform propagation between the input and output of the wire 1402 and the signal waveform propagation between the input and output of each of the instances 1400 and 1401 are calculated.

More concretely, in the instance output signal waveform calculation step, suppose that the instance 1400 drives the wire 1402 and the instance 1401, and then a circuit equation at the output terminal of the instance 1400 is set up to calculate an output signal waveform 1600 of the instance 1400 (FIG. 16(*b*)).

The second delay calculation method of FIG. 16 is different from the first delay calculation method of FIG. 14 in that the influence of the input signal waveform 1403 of the instance 1400 is incorporated into the circuit equation.

The input signal waveform 1403 is a signal waveform calculated from the drive power of an instance that drives the instance 1400 and the input signal waveform of that instance, the input terminal capacitance of the instance 1400, and the resistance and capacitance components of a wire that is connected to the input terminal.

This is followed by a wire output signal waveform calculation step. In the wire output signal waveform calculation step, the circuit equation at the output terminal of the wire 1402 at the time when the output signal waveform 1600 propagates through the wire 1402 is solved to calculate an input signal waveform 1601 of the instance 1401.

These two steps are repeatedly performed on every instance and wire, thereby making it possible to calculate signal waveforms at the input and output terminals of all the instances. From these calculated signal waveforms, both the instance delay time and the wire delay time can be calculated. In FIG. 16, the reference numeral 1602 is an output signal waveform of the instance 1401.

One merit of the second delay calculation method is that, as shown FIG. 16(*c*), when dividing a wire and an instance that is connected to the wire as single split units 1407 and 1408, respectively, there is held dependency between the split units 1407 and 1408.

In other words, prior to calculating the split unit 1408, the split unit 1407, which is earlier in the signal propagation sequence, is calculated and then the result is used to calculate the split unit 1408.

Delay calculations are carried out according to the signal propagation sequence. This produces demerits. Since, in addition to the delay calculation processing, it is required to determine a signal propagation sequence and to propagate information necessary for delay calculations according to the determined signal propagation sequence, this will take extra delay calculation processing time. On the other hand, there is a merit of providing considerably excellent delay calculation accuracy.

As described above, as a concrete delay calculation method for use in the delay calculation step S1302, there are several delay calculation techniques. Generally, both of the above-described delay calculation methods are not used and only one of them is usually used.

However, there is a procedure in which the delay calculation method of FIG. 14 is used for delay calculation of an entire LSI circuit and, with respect to clocks and critical paths which require very severe timing, information necessary for delay calculation about their corresponding portions is extracted and the delay calculation of FIG. 16 is used to perform delay calculations again.

As already described hereinbefore, it is not guaranteed that the layout step generates a layout shape allowing a delay calculation algorithm used in the subsequent delay calculation step to perform high-accuracy delay calculation. This produces the problem that there may be generated a layout form causing delay calculation difficulties to the delay calculation algorithm. As a result, the delay calculation accuracy for such a layout becomes poor, which causes the design procedure to return back to a particular design step.

Further, the delay calculation method of FIG. 14 suffers the problem that the accuracy of delay calculation for a circuit having a configuration with wires whose resistance and capacitance undergo considerable variation becomes poor. On the other hand, the delay calculation method of FIG. 16 also suffers the problem that it is required to perform path retrieval in the signal propagation direction. This results in an increased length of delay calculation processing time. However, most of the presently-used design flows employ only one of the delay calculation methods of FIGS. 14 and 16 and fail to make good utilization of both of them in effective manner. In addition, in the conventional techniques there exists no index for effectively and properly using these two delay calculation methods during the layout stage.

SUMMARY OF THE INVENTION

Accordingly, an object of the present invention is to provide an index for distinguishing between the use of a delay calculation method which deals in detail with signal propagation between the cell input and output terminals and the use of a delay calculation method which does not deal with signal propagation between the cell input and output terminals.

In a semiconductor integrated circuit formed of a plurality of cells connected by wires, the present invention provides a cell delay time calculation method for cell delay time calculation. The cell delay time calculation method of the present invention comprises a circuit simulation step of (a) inputting a transistor level net list of each cell, (b) varying at least one of the slew of an input signal waveform of each cell and the magnitude of a load capacitance which is connected to an output terminal of each cell, (c) performing a circuit simulation of each cell, and (d) obtaining an output signal waveform of each cell under a respective simulation condition, and a dependence calculation step of calculating, based on each simulation condition and each cell output signal waveform obtained in the circuit simulation step, the dependence of the slew of each cell output signal waveform upon at least one of the input slew rate and the load capacitance, wherein based on the dependence calculated in the dependence calculation step a delay time of each cell is calculated by distinguishing between the use of a delay calculation expression with consideration taken to the propagation of signal waveforms between each cell's input and output terminals and the use of another delay calculation expression without consideration taken to the propagation of signal waveforms between each cell's input and output terminals.

In the dependence calculation step of the cell delay time calculation method, (i) the relationship between the cell input slew rate/load capacitance and the cell output signal waveform slew is represented in the form of a correlation table for each cell, (ii) from the correlation table, a region, whose degree of the dependence of the output signal waveform slew upon the input slew rate/load capacitance is higher than a given dependence threshold level, is classified as a high-dependence region, while a region, whose degree of the dependence of the output signal waveform slew upon the input slew rate/load capacitance is lower than the given dependence threshold level, is classified as a low-dependence region, and (iii) the classified correlation table is held as a dependence table.

In the cell delay time calculation method, the dependence table is stored in a delay library of each cell.

In the cell delay time calculation method, the dependence calculation step includes an output signal waveform extraction step of (a) inputting a simulation result of the circuit simulation step and (b) extracting an output signal waveform group of each cell, an output signal waveform slew calculation step of (a) inputting the output signal waveform group, (b) subjecting all signal waveforms in the output signal waveform group to linear approximation for slew calculation, and (c) generating an output signal waveform slew group, a table generation step of generating, for each cell, a table indexed by input slew rate and load capacitance connected to output terminal, a correlation table generation step of embedding each of the output signal waveform slews of the output signal waveform slew group in the table for formation of the correlation table, and a classification step of (a) comparing each of the output signal waveform slews in the correlation table against a slew having a given value corresponding to the dependence threshold level and (b) classifying the correlation table into a high-dependence region and a low-dependence region.

The cell delay time calculation method further comprises a first delay calculation step of (a) inputting a gate level net list of parasitic capacitances and resistances extracted from a layout result of a semiconductor integrated circuit containing a plurality of cells and a delay library storing delay times of the plurality of cells and (b) calculating the delay time of the plurality of cells and the wires, the slew of the input signal waveform of each cell, and the load capacitance of each cell that is connected to each cell's output terminal, for obtaining input/output terminal information and a dependence decision step of (a) inputting the net list, the delay library, and the I/O terminal information, (b) calculating, for each cell, the dependence of the output signal waveform slew upon the input slew rate and the load capacitance, and (c) deciding, for each cell, in which of the high- and low-dependence regions of the dependence table the calculated dependence belongs, wherein as to a cell whose dependence belongs in the low-dependence region a first delay calculation expression without consideration taken to the propagation of signal waveforms between the cell's input and output terminals is used for delay time calculation, while as to a cell whose dependence belongs in the high-dependence region a second delay calculation expression with consideration taken to the propagation of signal waveforms between the cell's input and output terminals is used for delay time calculation.

The cell delay time calculation method further comprises a net list split step of (a) generating a first net list of information about a cell whose dependence belongs in the low-dependence region, resistance and capacitance information about wires connected to the cell's input and output terminals, and connection information about all cells connected to the wires and (b) generating a second net list of information about a cell whose dependence belongs in the high-dependence region, resistance and capacitance information about wires connected to the cell's input and output terminals, and connection information about all cells connected to the wires, a second delay calculation step of (a) calculating a first delay calculation result with the first delay calculation expression for the first net list and (b) calculating a second delay calculation result with the second delay calculation expression for the second net list, and a delay information synthesis step of combining the first delay calculation result and the second delay calculation result to generate a single delay calculation result.

In the cell delay time calculation method, the dependence decision step includes a high-dependence instance extraction step of (a) inputting the delay library, the I/O terminal information, and the net list, (b) extracting, for each cell contained in the net list, an input slew rate and a load capacitance from the I/O terminal information, (c) collating the dependence of the slew of an output signal waveform corresponding to the input slew rate and the load capacitance with the dependence table, and (d) registering a cell whose dependence belongs in the high-dependence region as high-dependence instance information, and a first waveform propagation flag set step of (a) inputting the high-dependence instance information and (b) setting, with respect to a cell contained in both the net list and the high-dependence instance information, a first waveform propagation flag as information that should belong in the first net list.

In the cell delay time calculation method, the net list split step includes a waveform propagation flag addition net list generation step of adding the first waveform propagation flag to the net list to generate a first flagged net list, a second waveform propagation flag set step of (a) setting a second waveform propagation flag to a cell that is connected to a cell to which the first waveform propagation flag has been set and (b) adding the second waveform propagation flag to the first waveform propagation flag addition net list to generate a second waveform propagation flagged net list, and a split step of (a) inputting the second waveform propagation flagged net list, (b) extracting a cell to which the first or second waveform propagation flag is not set and a wire that is connected to the cell to generate a first net list, and (c) extracting a cell to which the first or second waveform propagation flag is set and a wire that is connected to the cell to generate a second net list.

In the cell delay time calculation method, the second waveform propagation flag set step includes inputting a propagation stage count threshold level of a predetermined number of stages, selecting cells up to the predetermined number of stages of the propagation stage count threshold level as a cell that is connected to a cell to which the first waveform propagation flag has been set, and setting the second waveform propagation flag to the selected cells.

Further, the present invention provides a semiconductor integrated circuit layout optimization method for optimally laying out a semiconductor integrated circuit formed of a plurality of cells connected by wires. The semiconductor integrated circuit layout optimization method of the present invention comprises a layout step of (a) inputting a net list and a delay library of the plurality of cells, (b) generating placement/wiring routing information of the plurality of cells, and (c) generating RC information of parasitic elements of the placement/wiring routing information, an input/output terminal information extraction step of (a) inputting the RC information and the delay library and (b) calculating, for each cell, an input slew rate and a load capacitance that is connected to an output terminal of each cell, for extracting input/output terminal information, an instance extraction step of (a) inputting the I/O terminal information and the delay library, (b) calculating, for each cell, the dependence of the slew of an output signal waveform upon the input slew rate and the load capacitance, and (c) registering a cell whose dependence is higher than a predetermined dependence threshold level as instance information, and a constraint step of subjecting the cell registered as the instance information to re-layout so that the dependence of the cell becomes lower than the dependence threshold level.

In the semiconductor integrated circuit layout optimization method, the constraint step includes generating a layout constraint for use in re-layout of the cell registered in the instance information, and returning back to the layout step to perform the cell re-layout so as to meet the generated layout constraint.

In the cell delay time calculation method of the present invention, the dependence of an output signal waveform of a cell upon the input slew rate and cell load capacitance of the cell, i.e., a parameter showing signal waveform propagation dependence between the cell input and output terminals, is calculated. Then, based on the dependence thus calculated, it is determined which one of the delay calculation methods (i.e., the method that deals with signal waveform propagation between the cell input and output terminals and the method that does not deal with signal waveform propagation between the cell input and output terminals) is suitable for delay calculation. Then, according to the cell input slew rate and the load capacitance connected to the cell output terminal, a delay calculation tool with a high-accuracy delay calculation algorithm mounted therein is used for a portion that requires severe consideration for signal waveform propagation so as to calculate delay time at high accuracy. On the other hand, for a portion that does not require severe consideration for signal waveform propagation, a high-speed delay calculation tool, which is inferior in accuracy to the foregoing delay calculation tool, is used. Accordingly, the present invention is able to provide a high-speed and high-accuracy delay calculation method for delay calculation of an entire LSI circuit.

Further, in the semiconductor integrated circuit layout optimization method of the present invention, the dependency of the output signal waveform of a cell upon the input slew rate and load capacitance of the cell is calculated. If the dependence of a cell exceeds a predetermined dependence level, then the cell is subjected to re-layout so that the cell dependence becomes lower than the predetermined dependence level. This makes it possible to calculate delay times at high accuracy by using only a delay calculation tool having an algorithm that does not deal with signal waveform propagation between the cell input and output terminals.

BRIEF DESCRIPTION OF THE DRAWINGS

FIG. 3 is a diagram showing a way of executing a circuit simulation in the delay library generation flow.

FIG. 4(a) is a diagram showing an input/output signal waveform correlation table that is generated in the delay library generation flow, FIG. 4(b) is a diagram showing a dependence diagram when the load capacitance is varied, and FIG. 4(c) is a diagram showing a dependence table when the input slew rate is varied.

FIG. 5(a) is a diagram showing a concrete example of the dependence table when the load capacitance is varied and FIG. 5(b) is a diagram showing a concrete example of the dependence table when the input slew rate is varied.

FIG. 9(a) is a diagram showing an input/output terminal information setting in the delay calculation flow and FIG. 9(b) is a diagram showing a waveform propagation flag setting.

DESCRIPTION OF THE INVENTION

Hereinafter, preferred exemplary embodiments of the present invention will be described by making reference to the attached drawing figures.

EMBODIMENT 1

Figure 1:
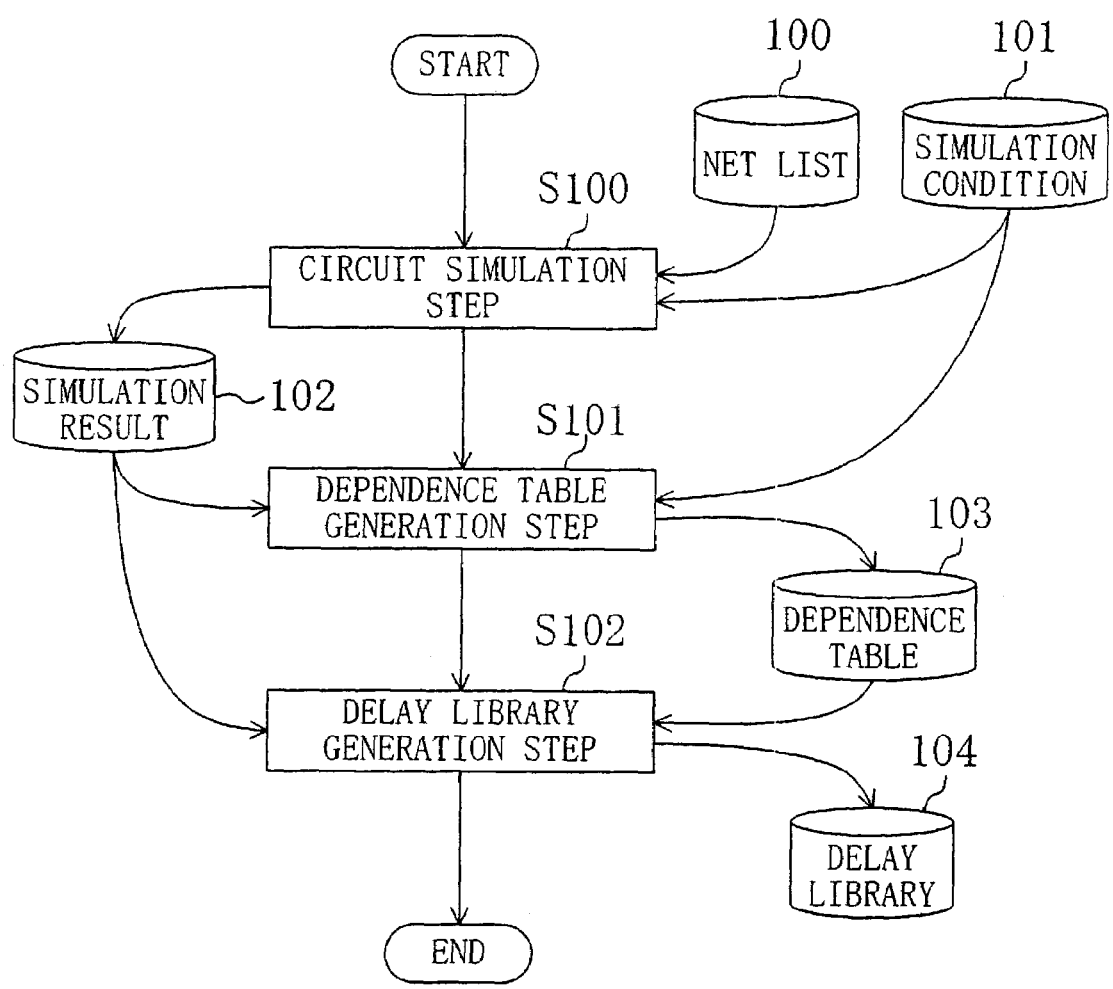
FIG. 1 is a diagram showing a delay library generation flow in a first exemplary embodiment of the present invention.

FIG. 1 shows a procedure of generating a delay library in a cell delay calculation method in accordance with a first embodiment of the present invention. Here, a technique of generating a delay library for a cell exemplarily shown in FIG. 3 will be described concretely. Shown in FIG. 3 are a cell (instance) 300, an input signal waveform group 301 of input signal waveforms that are fed to the instance 300, a load capacitance group 302 of load capacitances that are connected to an output terminal of the instance 300, an output signal waveform 303 which is one of output signal waveforms in an output signal waveform group 200, a voltage level 304 for use in linear approximation, and a linearly-approximated waveform 305 which is a linear approximation of the output signal waveform 303.

Firstly, in a circuit simulation step S100, a net list 100 at the transistor level and a simulation condition 101 for the cell 300 of FIG. 3 are input to perform a circuit simulation with a circuit simulator such as SPICE, and a simulation result 102 is output. Here, the simulation condition 101 comprises the input signal waveform group 301 which is a collection of a plurality of signal waveforms having different slew values and the load capacitance group 302 which is a collection of a plurality of capacitance values. For example, as the input signal waveform group 301, a collection of four signal waveforms having a slew of 1 ns, a slew of 2 ns, a slew of 3 ns, and a slew of 4 ns, respectively, is used. Further, as the load capacitance group 302, a collection of four load capacitances having a capacitance value of 10 fF, a capacitance value of 50 fF, a capacitance value of 200 fF, and a capacitance value of 400 fF, respectively, is used. Note that the number of signal waveforms forming the input signal waveform group 301 and the number of load capacitances forming the load capacitance group 302 are not limited to the above. It is the delay library designer who decides, taking into consideration accuracy and circuit simulation processing time, an optimum number of input signal waveforms for the input signal waveform group 301 and an optimum number of load capacitances for the load capacitance group 302.

Then, one signal waveform is chosen from among the input signal waveform group 301 and fed to the input terminal of the cell 300 and one load capacitance is chosen from among the load capacitance group 302 and brought into connection with the output terminal of the cell 300, wherein the cell 300 is circuit simulated using the circuit simulator to calculate an output signal waveform, drive power, current characteristic, et cetera at the output terminal of the cell 300. Such circuit simulation is performed on combinations of all the input signal waveforms in the input signal waveform group 301 and all the load capacitances in the load capacitance group 302, thereby to calculate an output signal waveform, drive power, and current characteristic and the simulation result 102 is output.

Next, in a dependence table generation step (a dependence calculation step) S101, the simulation condition 101 and the simulation result 102 are input and a relationship among the input slew rate, the load capacitance, and the output signal waveform slew of the cell 300 is output in the form of a dependence table 103. The dependence table generation step S101 will be explained in more detail with reference to FIG. 2.

Figure 2:
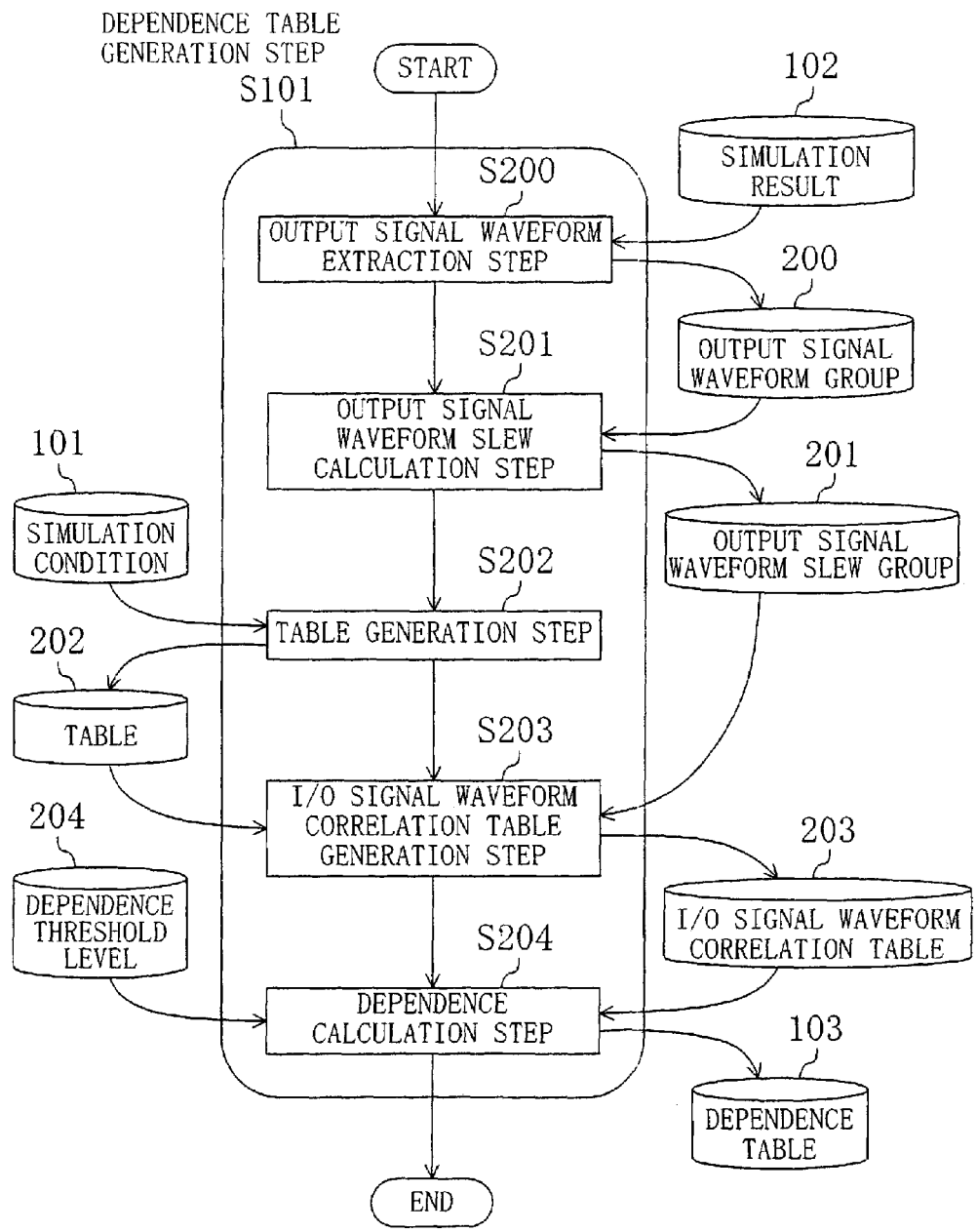
FIG. 2 is a diagram showing a dependence table generation step in the delay library generation flow.

In an output signal waveform extraction step S200 of the dependence table generation step S101 of FIG. 2, extracted from the simulation result 102 is the output signal waveform group 200 which is a collection of output signal waveforms at the output terminal of the cell 300. These output signal waveforms of the output signal waveform group 200 are generally nonlinear signal waveforms.

Next, in an output signal waveform slew calculation step S201, the output signal waveform group 200 is input and all the signal waveforms of the output signal waveform group 200 are subjected to linear approximation and their slews are calculated and the results are output as an output signal waveform slew group 201. In the linear approximation, two arbitrary voltage levels 304 on the signal waveform 303 are determined and points where the two voltage levels 304 and the signal waveform 303 intersect are connected together by a straight line to generate the linearly-approximated waveform 305. Then, the slew of the linearly-approximated waveform 305 is calculated. Here, the two arbitrary voltage level 304 are voltage levels that are determined by the delay library designer so that V_A≠V_B holds where V_A and V_B represent the voltage levels 304, respectively.

This is followed by a table generation step S202 in which the simulation condition 101 is input and a table 202 is generated in which the slew of the signal waveforms of the input signal waveform group 301 and the size of the load capacitances of the load capacitance group 302 are indexed. The table 202 becomes a 4×4 table if the input signal waveform group 301 comprises four different slews (for example, 1 ns, 2 ns, 3 ns, and 4 ns) and four different load capacitances (for example, 5 fF, 10 fF, 100 fF, and 400 fF).

Reference is made to FIG. 3 which shows the 4×4 table 202 with four different input slew rates (i.e., slew1, slew2, slew3, and slew4) and four different load capacitances (i.e., laod1, load2 load3, and load4). Here, only the indexes are written in the table 202. That is, the slew of an output signal waveform, when the input slew rate is slew1 and the load capacitance is load 1, is not yet written in the table 202.

Further, in an input/output signal waveform correlation table generation step S203 (a correlation table generation step), the table 202 and the output signal waveform slew group 201 are input, the table 202 is fed the values of the output signal waveform slew group 201, and an input/output signal waveform correlation table 203, as shown in FIG. 4(*a*), is generated. In such a value input technique, from the output signal waveform slew group 20:L a output signal waveform slew corresponding to the input slew rate and the load capacitance written in the table 202 is extracted and written in the table 202.

This is followed by a dependence calculation step S204 (a classification step) in which the input/output signal waveform correlation table 203 and a dependence threshold level 204 are input, and the variation amount of an output signal waveform with respect to the variation in input slew rate and load capacitance is compared with the dependence threshold level 204 thereby to generate the dependence table 103. This dependence calculation step S204 will be described below in detail.

First, two dependence tables 400 and 401 (FIGS. 4(*b*) and 4(*c*)) are prepared from the input/output signal waveform correlation table 203. The dependence table 400 is a table showing the output signal waveform slew variation amount when the load capacitance is varied, with respect to the input/output signal waveform correlation table 203. The output signal waveform variation amount is calculated using the following Expression (1).

$$val\_a\_bc = slew\_ac - slew\_ab \qquad (1)$$

The variables in Expression (1) are the values that are shown in the input/output signal waveform correlation table 203 and the table 400.

On the other hand, the dependence table 401 is a table showing the output signal waveform slew variation amount when the input slew rate is varied, with respect to the input/output signal waveform correlation table 203. The output signal waveform variation amount is calculated using the following Expression (2).

$$val\_ab\_c = slew\_bc - slew\_ac \qquad (2)$$

The variables in Expression (2) are the same as in Expression (1).

Next, the values val_a_bc of the table 400 and the values val_ab_c of the table 401 are subjected to comparison. Based on the output signal waveform variation amount of the cell 300 with respect to the slew of the input signal waveform that is input to the cell 300 or the load capacitance value, the values whose variation amount is smaller than the dependence threshold level 204 are defined as a low-dependence region while the values whose variation amount is greater than the dependence threshold level 204 are defined as a high-dependence region, wherein there is drawn a boundary line between the low-dependence region and the high-dependence region. In the dependence tables 400 and 401, regions 402 and 403 are high-dependence regions.

Referring now to FIG. 5, there are shown concrete examples of the dependence tables. FIGS. 5(*a*) and 5(*b*) show a dependence table 500 and a dependence table 501 respectively. Each of the dependence tables 500 and 501 is prepared from the result of executing a circuit simulation in which the cell 300 is an inverter cell, the input slew rates are 1 ns, 2 ns, 3 ns, 4 ns, and 5 ns and the load capacitances are 10 fF, 50 fF, 100 fF, and 300 fF. The dependence table 500 shows actual dependence table results when the load capacitance value is varied. In the dependence table 500, in a region where the load capacitance value is small, even when there is an increase of 1 ns in the input slew rate, the output signal waveform slew undergoes an increases of only about one third of the input slew rate increase, i.e., about 0.3 ns. On the other hand, in a region where the load capacitance value is great, when there is an increase of 1 ns in the input slew rate, the output signal waveform slew correspondingly undergoes about the same increase amount, i.e., about 1 ns. Here, for example, when the dependence level 204 is assigned a value of 50% of the input signal waveform variation, i.e., a value of 0.5 ns, the region of smaller load capacitance is decided as a low-dependence region while on the other hand the region of greater load capacitance is decided as a high-dependence region.

Likewise, the table 501 is a dependence table of actual values when the input slew rate is varied. In the dependence table 501, in a region where the load capacitance value is great and, in addition, the absolute value of the input slew rate is small, and in a region where the load capacitance is small and the absolute value of the input slew rate is great, the output signal waveform slew variation amount becomes reduced with respect to the variation in input slew rate. On the other hand, in a region where the load capacitance value is small and, in addition, the absolute value of the input slew rate is small, and in a region where the load capacitance value is great and the absolute value of the input slew rate is great, the output signal waveform slew variation amount becomes increased. Here, as in the dependence table 500, for example, when the dependence level 204 is assigned a value of 20% of the input signal waveform variation, i.e., a value of 0.2 ns, a region where the load capacitance value is great and the absolute value of the input slew rate is small and a region where the load capacitance value is small and the absolute value of the input slew rate is great are decided as a low-dependence region. On the other hand, a region where both the load capacitance value and the absolute value of the input slew rate are small and a region where both the load capacitance value and the absolute value of the input slew rate are great are decided as a high-dependence region. If all the values in the table 500 fall below the dependence level 204, then all the regions will be defined as a low-dependence region. On the other hand, if all the values in the table 500 exceed the dependence level 204, then all the regions will be defined as a high-dependence region.

From the above, in the table 500, a region 502 is defined as a high-dependence region and the other remaining regions are defined as a low-dependence region. Likewise, in the table 501, a region 503 is defined as a high-dependence region and the other remaining regions are defined as a low-dependence region. Note that the value of the dependence level 204 is the value that is predefined by a delay library designer. Further, the dependence level 204 may be determined individually for each cell and region division may be carried out by the use of a dependence level common to all cells forming a delay library.

In FIGS. 4(*b*) and 4(*c*), either the output signal waveform slew variation amount when the input slew rate is varied or the output signal waveform slew variation amount when the load capacitance is varied is found to prepare the dependence tables 400 and 401. In addition to performing region division by setting, as input simulation conditions, various input slew rates and load capacitances and by comparing either the input slew rate or the load capacitance variation amount with a given threshold level, it is possible to prepare a dependence table by making comparison between the output signal waveform slew and a predetermined threshold level. Further, it is of course possible that any one of the input slew rate and the load capacitance is fixed to prepare a dependence table.

Referring again to FIG. 1, in the delay library generation step S102 the dependence table 103 and the simulation result 102 are input for generation of the delay library 104 of the cell 300. Extraction of drive power and electric characteristic from the simulation result 102 is carried out and their values are converted to a delay library format for a delay calculation tool, and the converted delay library and the dependence table 103 are output as the delay library 104.

As described above, a correlation between the input and output signal waveforms is represented in the form of a dependence table and the dependence table is incorporated into the delay library, whereby the dependence of the output signal waveform of an instance upon the input slew rate and load capacitance of the instance can be calculated. On the basis of the dependence degree thus calculated, it becomes possible to decide which one of a delay calculation method that deals with signal waveform propagation between the cell input and output terminals and another method that does not deal with signal waveform propagation between the cell input and output terminals is suitable when performing delay calculations.

Hereinafter, a delay calculation method making utilization of the above-described dependence will be described.

Figure 6:
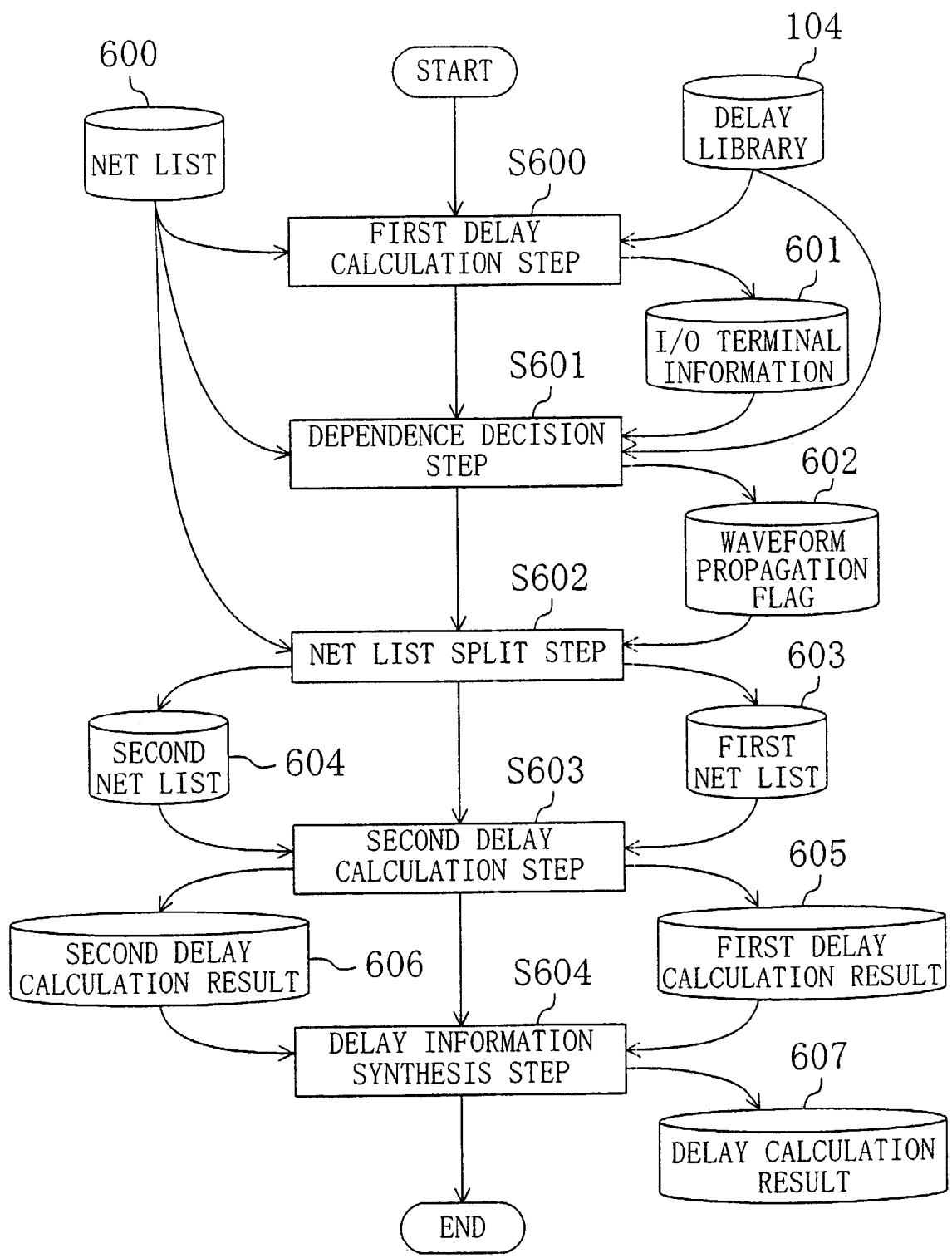
FIG. 6 is a diagram showing a delay calculation flow in the first embodiment of the present invention.

Reference is made to FIG. 6 which shows a delay calculation method in accordance with the present invention. In a first delay calculation step S600 of FIG. 6, in the first place a net list 600 and the delay library 104 are input and input/output terminal information 601 is calculated for all instances included in the net list 600. The net list 600 is a parasitic resistance and capacitance extraction from the layout result and can be represented in a DSPF format. The delay library 104 is the delay library prepared in the first embodiment.

In the first delay calculation step S600, the slew of an input signal waveform that is input to an input terminal of each instance of the net list 600 and the total resistance and capacitance connected to the output terminal or the effective capacitance are calculated and their information is contained in the input/output terminal information 601.

For example, FIG. 9(*a*) shows a concrete example in which instances of instance1, instance2, instance3, instance4, and instance5, input slew rates of slew1, slew2, slew3, slew4, and slew5, and load capacitances of load1, load2 load3, load4, and load5 are output as the input/output terminal information 601.

Further, in the delay calculation method used in the first delay calculation step S600, any type of delay calculation tool can be employed as long as it is able to output the input slew rate and the load capacitance of an instance contained in the net list 600.

Next, in a dependence decision step S601, the input/output terminal information 601, the delay library 104, and the net list 600 are input and for all the instances contained in the net list 600 the input/output terminal information 601 is compared against the delay library 104 for dependence decision and a waveform propagation flag 602 is provided. The detail of the dependence decision step S601 is shown in FIG. 7.

Figure 7:
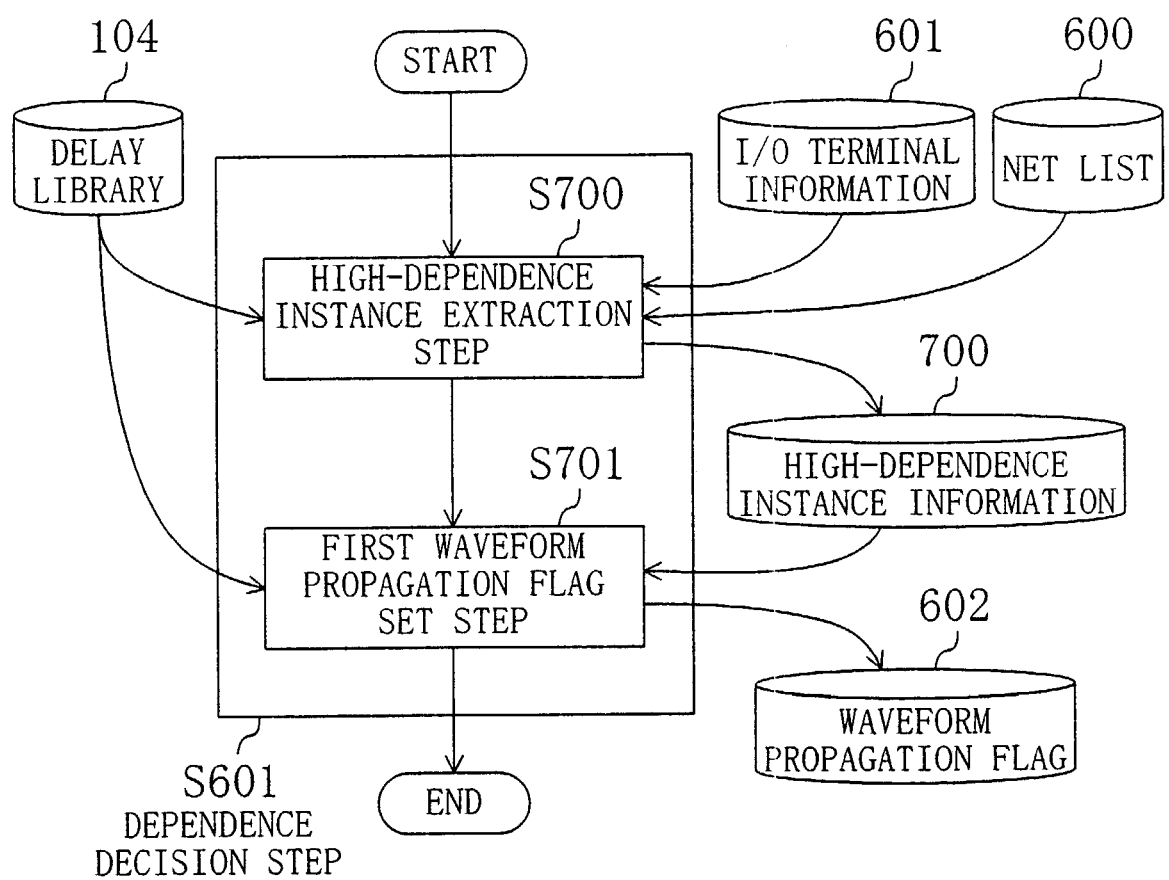
FIG. 7 is a diagram showing a dependence decision step in the delay calculation flow.

The dependence decision step S601 of FIG. 7 comprises two substeps, namely a high-dependence instance extraction step S700 and a first waveform propagation flag set step S701. In the high-dependence instance extraction step S700, the net list 600, the input/output terminal information 601, and the delay library 104 are input, input slew rate and load capacitance are extracted for each instance from the input/output terminal information 601 for comparison with the dependence table of the delay library 104, and if the input slew rate and the load capacitance belong in the high-dependence region of the dependence table, then the instance in point is output as high-dependence instant information 700.

As described above, of the instances contained in the net list 600, ones that operate in the high-dependence region of the dependence table are all extracted.

Next, in the first waveform propagation flag set step S701, the high-dependence instance information 700 is referred to for setting a waveform propagation flag to an instance which operates in the high-dependence region while no flag is set to an instance that is not written in the high-dependence instance information 700 and the flag set situation of each instance is output as a waveform propagation flag 602. For example, in an example of FIG. 9(*b*), as to the input slew rate and the load capacitance of the instance2, reference is made to the dependence table of the delay table of the instance2 and the result shows that the instance2 operates in the high-dependence region. Accordingly, a waveform propagation flag is set to the instance2. No waveform propagation flag is set to the other remaining instances instance1, instance3, instance4, and insance5.

Figure 13:
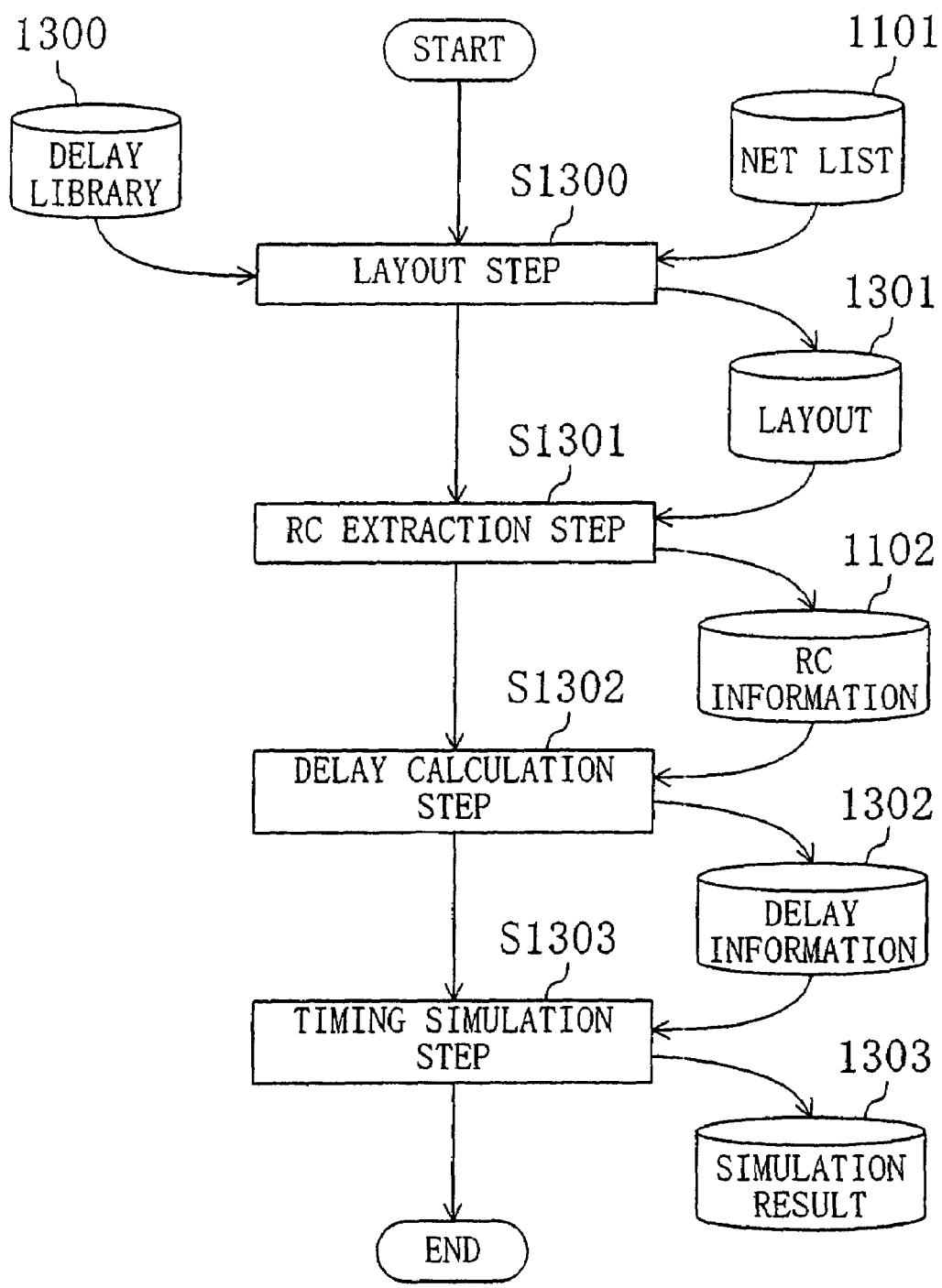
FIG. 13 is a post-layout design flow in a conventional technique.
Figure 14A:
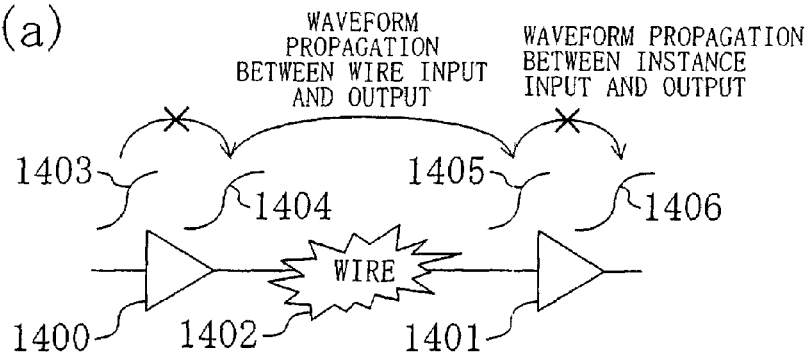
FIG. 14(a) is a diagram showing a signal waveform propagation in a conventional technique.
Figure 14B:
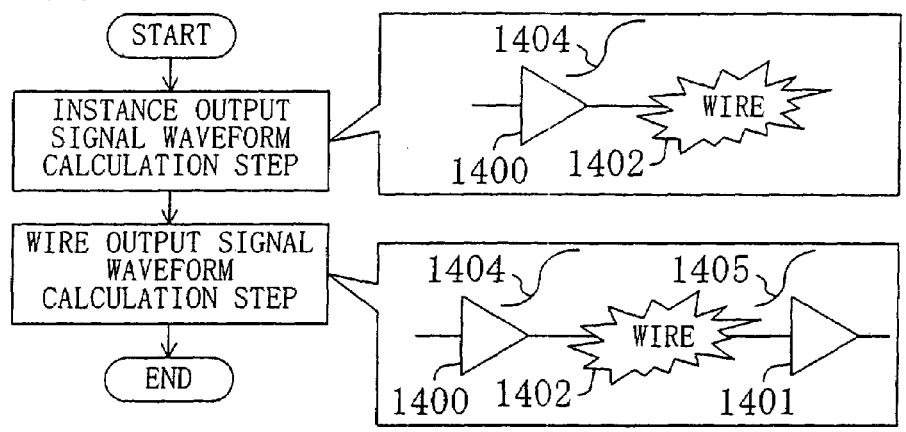
FIG. 14(b) is a diagram showing a signal waveform calculation method in the conventional technique.
Figure 14C:
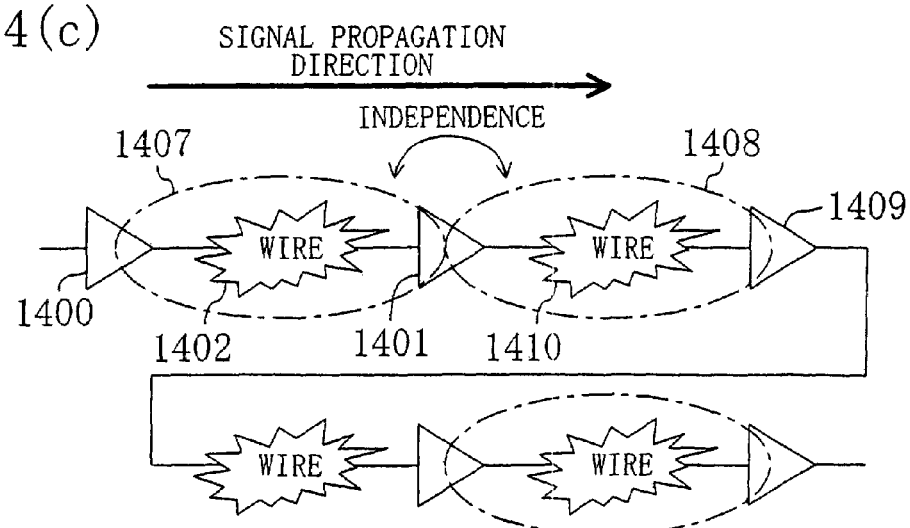
FIG. 14(c) is a diagram explaining a manner of the signal waveform calculation method in the conventional technique.
Figure 15A:
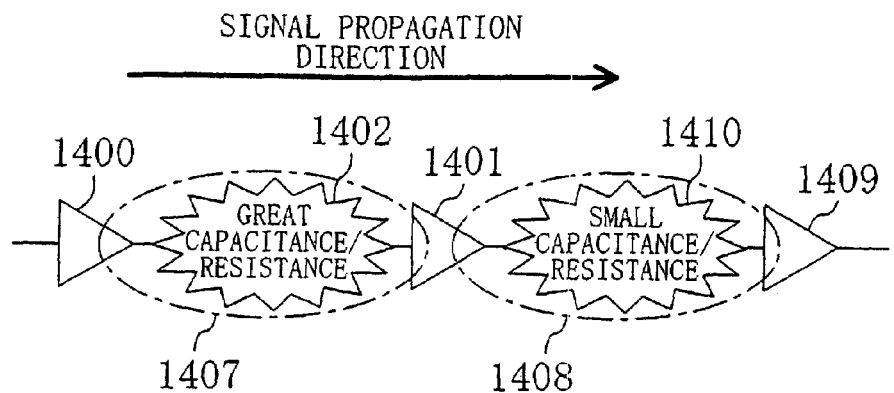
FIG. 15(a) is a diagram showing an example of a circuit as a target for delay calculation.
Figure 15B:
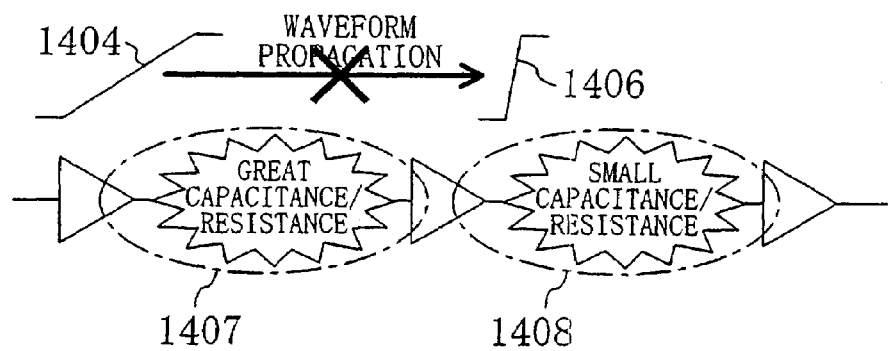
FIG. 15(b) is a diagram showing an exemplary case in which the accuracy of delay calculation on the circuit of FIG. 15(a) becomes poor.
Figure 15C:
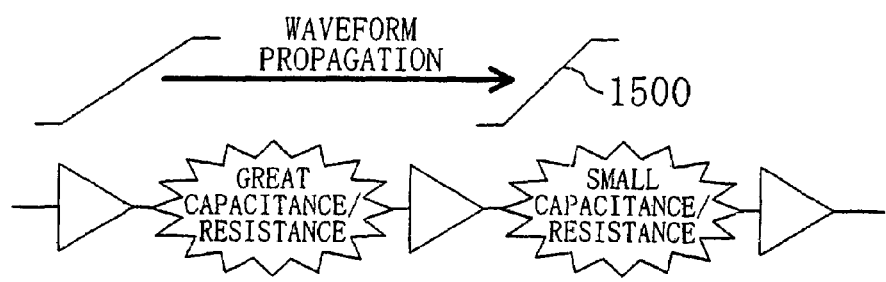
FIG. 15(c) is a diagram showing another exemplary case.
Figure 16A:
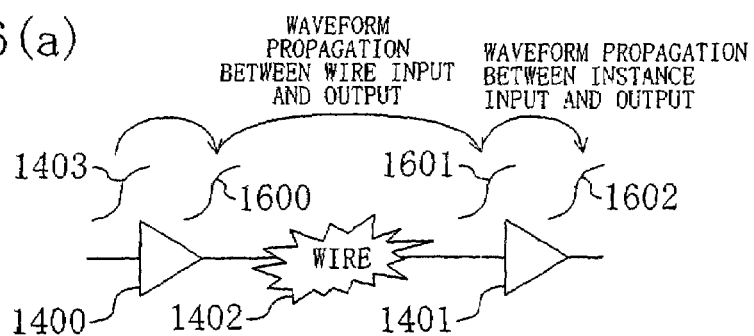
FIG. 16(a) is a diagram showing a signal waveform propagation in a conventional technique.
Figure 16B:
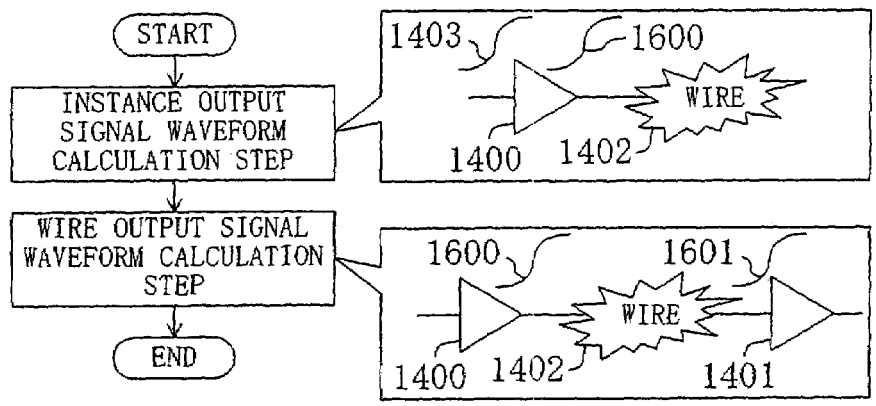
FIG. 16(b) is a diagram showing another signal waveform calculation technique in the conventional technique.
Figure 16C:
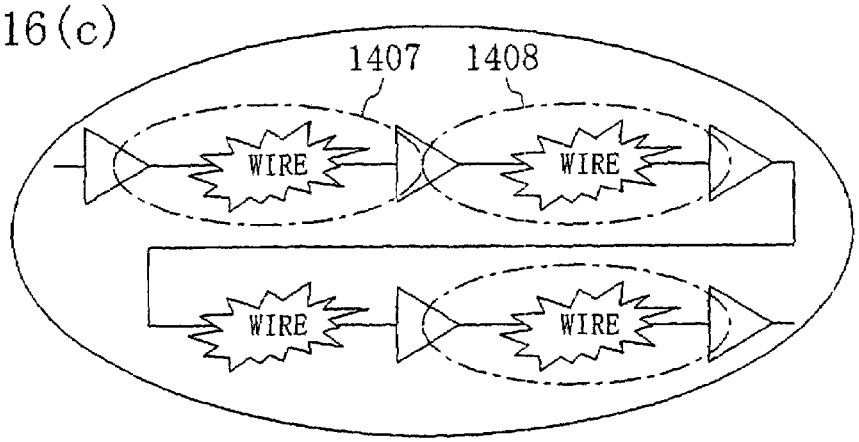
FIG. 16(c) is a diagram showing a range to which signal waveform calculation is applied in the conventional technique.
Figure 17:
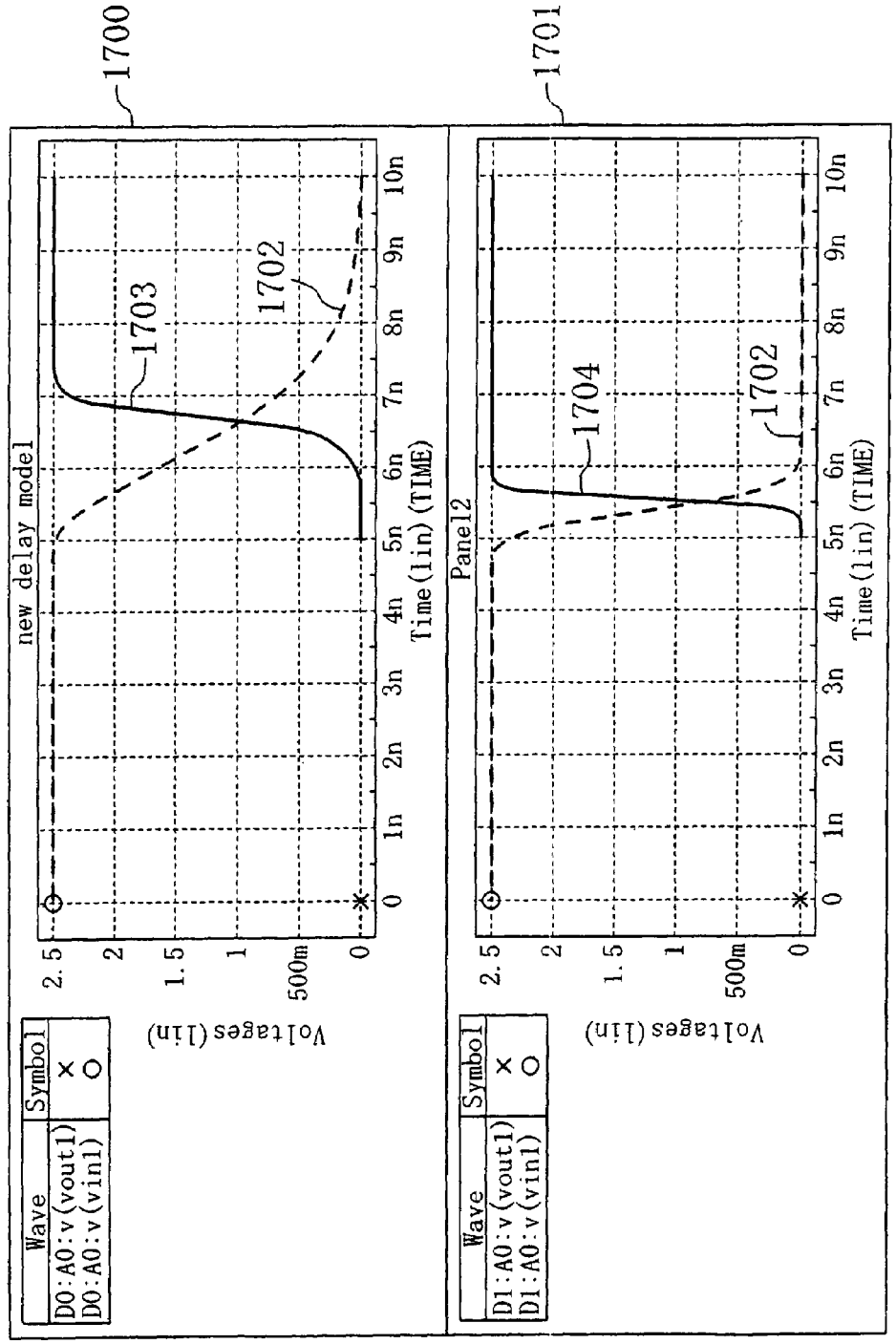
FIG. 17 is a diagram showing circuit simulation execution results in the conventional technique.

Next, in a net list split step S602, the net list 600 and the waveform propagation flag 602 are input, there is made a classification to a collection of instances and wires that are subjected to delay calculation with consideration taken to the propagation of waveforms and another collection, and these collections are output as a second net list 604 and as a first net list 603, respectively. The details of the net list split step S602 are shown in FIG. 13.

Figure 8:
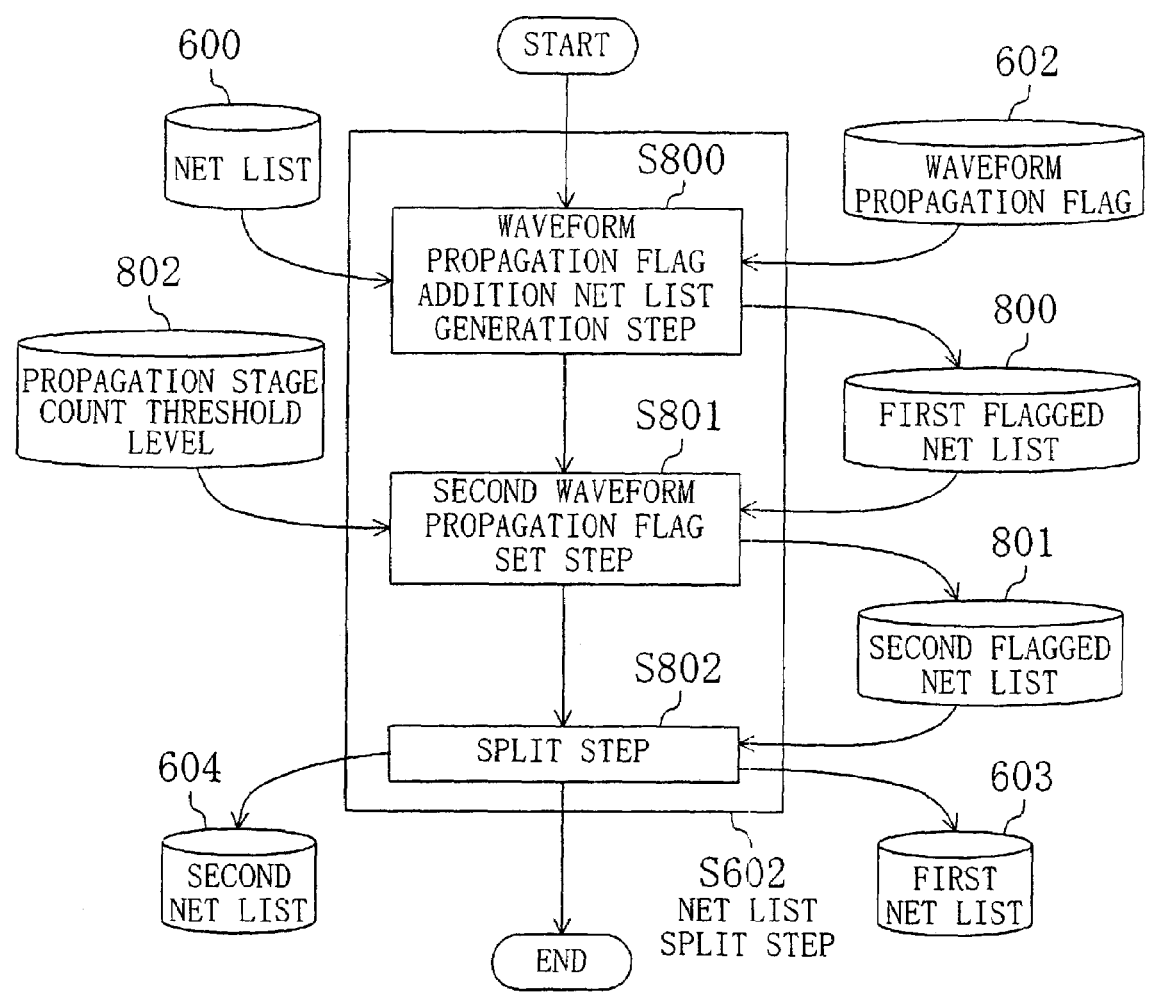
FIG. 8 is a net list split step in the delay calculation flow.

The net list split step S602 of FIG. 8 is made up of a waveform propagation flag addition net list generation step S800, a second waveform propagation flag set step S801, and a split step S802. Stored in the waveform propagation flag 602 is waveform propagation flag information for each instance as shown in FIG. 9(b). In other words, the name of an instance and the waveform propagation flag set situation of the instance are stored. Note that such information does not contain therein connection information between each instance.

Here, for the purpose of simplifying the following description, suppose that the circuit written in the net list 600 is the circuit in which there are established connections between the instance1 and the instance2, between the instance2 and the instance3, between the instance3 and the instance4, and between the instance4 and the instance5.

In the waveform propagation flag addition net list generation step S800, the waveform propagation flag 602 is referred to for every instance of the net list 600 to find whether a waveform propagation flag is set thereto. If there exists an instance with a waveform propagation flag, then the waveform propagation flag of the instance is set to the net list 600 and the net list is output as a first flagged net list 800.

Next, in the second waveform propagation flag set step S801, the first flagged net list 800 and a propagation stage count threshold level 802 are input, an instance that drives the instance with a waveform propagation flag is "1", and a waveform propagation flag is set to cells up to the number of stages set in the propagation stage count threshold level 802. In the example of FIG. 9, the instance1, instance2, instance 3, instance 4, and instance5 are subjected, in that order, to waveform propagation flag set decision to decide whether a waveform propagation flag should be set to these instances, in the signal propagation direction and in the waveform propagation flag set order. Note that the number set in the propagation stage count threshold level 802 is a natural number.

Figure 10A:
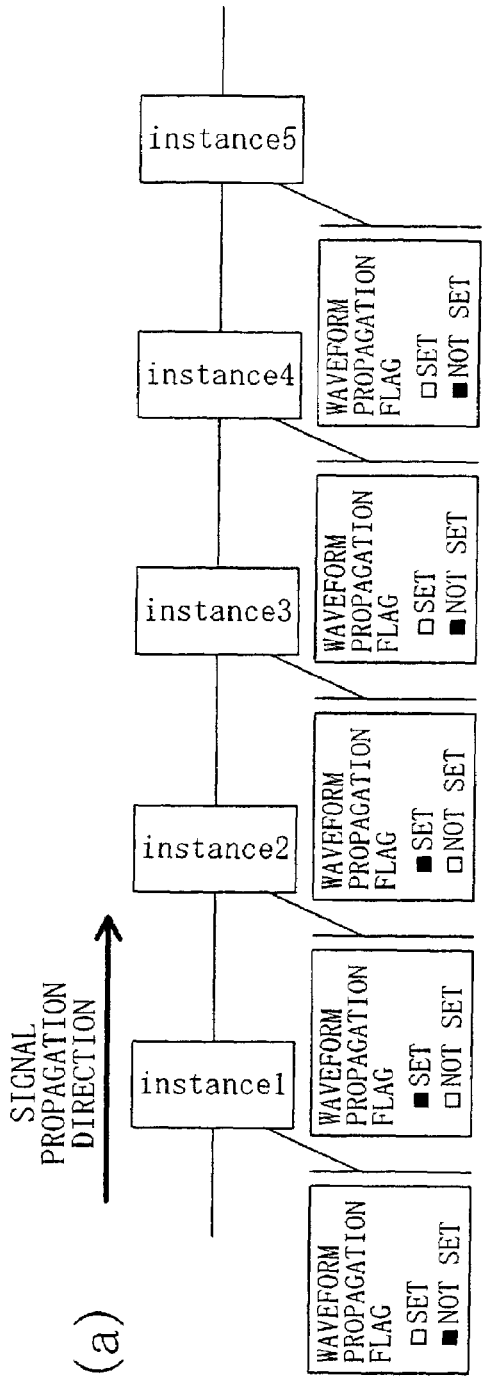
FIG. 10(a) is a diagram showing a waveform propagation flag setting in the delay calculation flow and FIG. 10(b) is a diagram showing a net list split technique in the delay calculation flow.

FIG. 10(a) shows an example in which the propagation stage count threshold level 802 is set to a value of "1" and a waveform propagation flag is set to the instance3 that is driven by the instance2 with a waveform propagation flag, and the net list in point is output as a second flagged net list 801.

The description has been made in terms of an example in which the propagation stage count threshold level 802 is set to a value of "1". However, it is required that the value be changed according to how much the influence of signal waveform propagation appears toward the signal propagation direction.

It is required that the set value of the propagation stage count threshold level 802 be predetermined. Different set values may be used according to the instance logic and drive power. Alternatively, the same set value may be used.

Next, in the split step S802, the second flagged net list 801 is input and a net list portion relating to instances to which no waveform propagation flag has been set is extracted as the first net list 603 while on the other hand a net list portion relating to instances to which a waveform propagation flag has been set is extracted as the second net list 604.

Figure 10B:
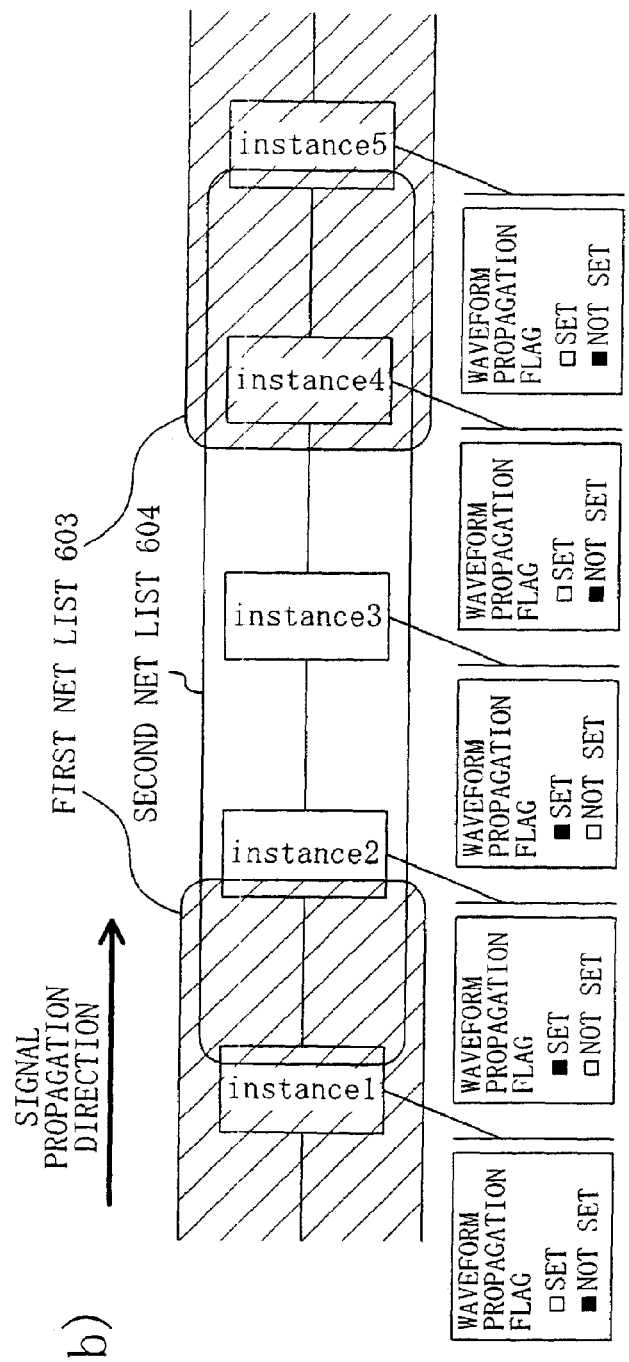

In an example of FIG. 10(b), the two instances instance2 and instance3 are waveform propagation flagged. Therefore, written in the second net list 604 are information about the resistance and capacitance of a wire extending from the instance1 to the instance2, information about the resistance and capacitance of a wire extending from the instance2 to the instance3, information about the resistance and capacitance of a wire extending from the instance3 to the instance4, and connection information about the instance1, the instance2, the instance3, and the instance4.

The reason why the information about the instances instance1 and instance4 with no waveform propagation flag is written in the second net list 604 is that the information about the instance1 is necessary for calculation of the input signal waveform of the instance2 and the information about the instance4 is necessary for calculating a load capacitance that the instance3 drives.

Written in the first net list 603 are information about the resistance and capacitance of a wire extending from the instance1 to the instance2, information about the resistance and capacitance of a wire extending from the instance3 to the instance4, information about the resistance and capacitance of a wire extending from the instance4 to the instance5, and connection information about the instances instance1, instance2, instance3, instance4, and instance5.

With respect to the overlapping portions between the first net list 603 and the second net list 604 such as the information of the wire from the instance1 to the instance2 and the information of the wire from the instance3 to the instance4, their delay information is also calculated repeatedly in the following delay time calculation. In such a case, as to the delay time of the wire from the instance3 to the instance4, a delay calculation result calculated using the second net list 604 is used. The reason is that since in the delay calculation using the second net list 604 the delay time of the wire from the instance3 to the instance4 is calculated with consideration taken to the influence of the input signal waveform of the instance3, its accuracy is higher than the delay time of the wire from the instance3 to the instance4 that is calculated using the first net list 603. On the other hand, the delay times of the wires other than the foregoing wire (e.g., the wire from the instance1 to the instance2) can be calculated using any one of the net lists.

As described above, the first and second net lists 603 and 604 are input, delay calculations are carried out in the second delay calculation step S603, and a first delay calculation result 605 and a second delay calculation result 606 are output.

Mounted in the second delay calculation step S603 are the two types of delay calculation tools described in the prior art part. The characteristic of one of the tools is shown as a first delay calculation tool and the characteristic of the other tool is shown as a second delay calculation tool. The first delay calculation tool takes into consideration the signal waveform propagation between the input and output of a wire but does not take into consideration the signal waveform propagation between the input and output terminals of an instance. Therefore, the first delay calculation tool is a fast delay calculation tool. On the other hand, the second delay calculation tool is able to deal with not only the signal waveform propagation between the input and output of a wire but also the signal waveform propagation between the input and output terminals of an instance. Therefore, the second delay calculation tool is a very high-accuracy delay calculation tool but is slow in delay processing. These delay calculation tools are implemented by any commercially-available delay calculation tools or circuit simulators.

In the second delay calculation step S603, for the first net list 603 the first delay calculation tool is used for delay time calculation to generate the first delay calculation result 605. Further, for the second net list 604, the second delay calculation tool is used for delay time calculation to generate the second delay calculation result 606.

Next, in a delay information synthesis step S604, the first delay calculation result 605 and the second delay calculation result 606 are input and combined into a single delay calculation result 607.

In the delay information synthesis step S604, the first delay calculation result 605 and the second delay calculation result 606 are summed together; however, as described in the net list split step S602, as to the overlapping information, delay information obtained as the second delay calculation result 606 has priority.

The foregoing delay calculation procedure of the present embodiment provides a high-speed and high-accuracy delay calculation method for use in delay calculation of an entire LSI circuit by applying the first delay calculation tool with a high-accuracy delay calculation algorithm to a portion that requires severe consideration for signal propagation while applying the second delay calculation tool inferior in accuracy but superior in processing rate to the first delay calculation tool to a portion that requires neither high-accuracy nor severe consideration for signal propagation, on the basis of the slew and load capacitance of an input signal waveform of an instance.

EMBODIMENT 2

A second exemplary embodiment of the present invention will be described below with reference to the drawing figures.

Figure 11:
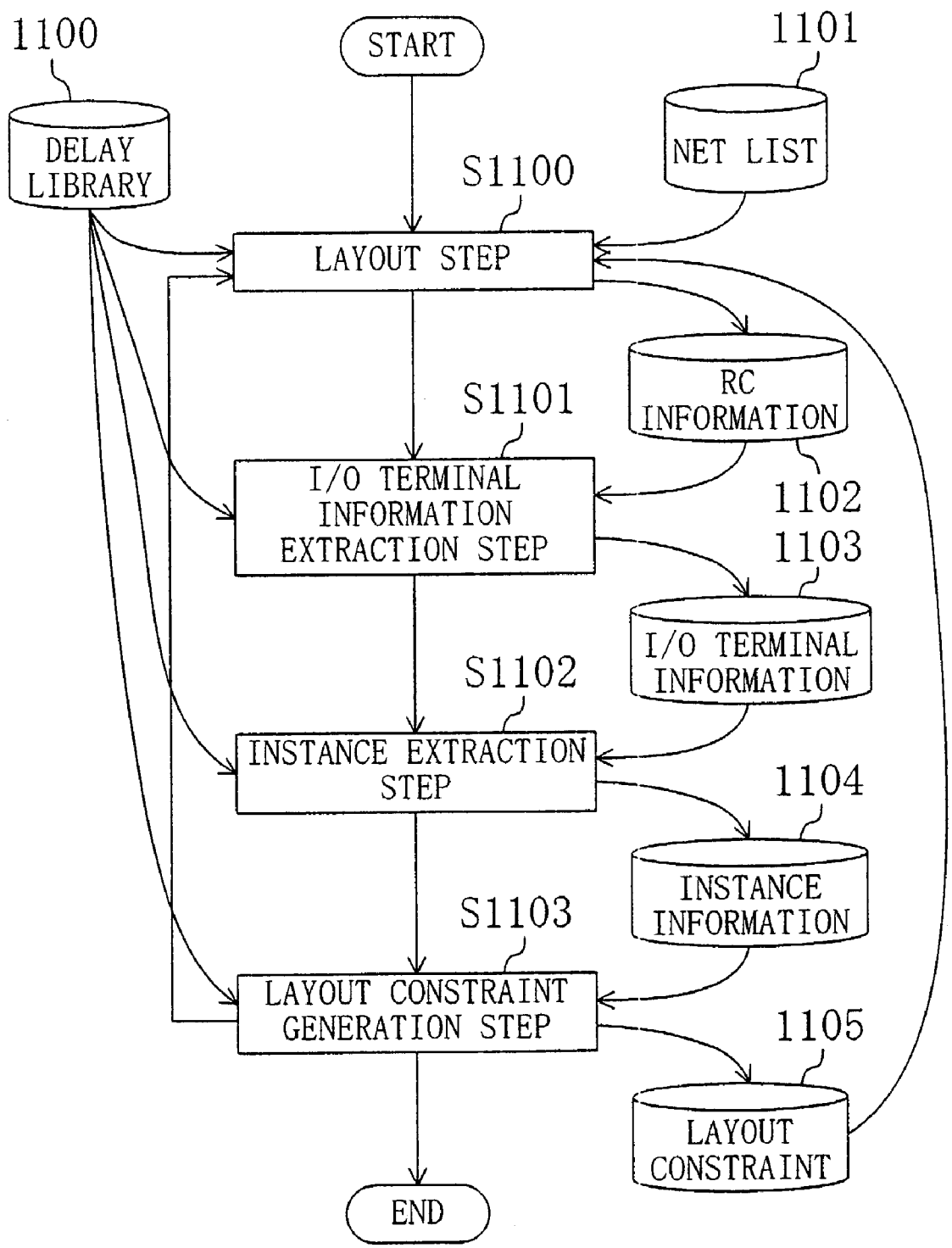
FIG. 11 is a diagram showing an optimization layout generation flow in a second exemplary embodiment of the present invention.

FIG. 11 shows a semiconductor integrated circuit layout optimization method in accordance with the second embodiment of the present invention. In accordance with the present embodiment, at least one of the input slew rate and the load capacitance of an instance is controlled when performing a timing driven layout, thereby to generate a layout suitable for the delay calculation algorithm of a delay calculation tool that is used at the time of post-layout back annotation.

In the following description, an example case will explained in which the aforesaid delay calculation algorithm is one that does not deal with the signal waveform propagation between the input and output terminals of an instance.

Referring to FIG. 11, in a layout step S1100 a net list 1101 and a delay library 1100 are first input for placement/wire routing and thereafter resistance and capacitance components of a parasitic element are extracted to generate RC information 1102. The delay library 1100 comprises the delay library 104 described in the first embodiment of the present invention. The net list 1101 is a net list in which only a connection relationship between each instance is written and which is described using languages such as verilog and VHDL. Further, the RC information 1102 can be represented in a DSPF format.

Figure 12A:
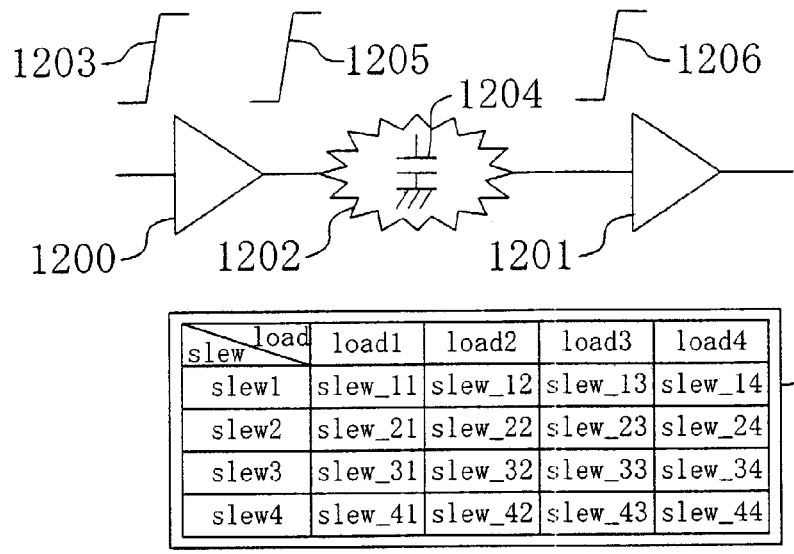
FIG. 12(a) is a diagram showing input/output terminal information extraction in the optimization layout generation flow and FIG. 12(b) is a diagram showing dependence extraction in the optimization layout generation flow.

Next, in an input/output terminal information extraction step S1101 the RC information 1102 and the delay library 1100 are input and the input slew rate and the load capacitance connected to the output terminal are calculated for every instance contained in the RC information 1102 and, as a result of such calculation, an input/output terminal information 1103 is output. The RC information 1102 is output in the format of DSPF, being represented as a collection of sets made up of two instances 1200 and 1201 and a wire 1202 which establishes connection between the two instances 1200 and 1201, as shown in FIG. 12(a).

In the input/output terminal information extraction step S1101, calculation is performed for each set of the collection and the input/output terminal information 1103 is calculated. In the calculation, the capacitance that is driven by the instance 1200, i.e., the input terminal capacitance of the wire 1202 and the instance 1201, may be used either as a load capacitance 1204 which is a total capacitance value written in the DSPF file or as an effective capacitance value with consideration taken to the resistance component of the wire 1202 by solving a circuit equation at the output terminal of the instance 1200.

Next, a circuit equation at the output terminal of the instance 1200 is set up. Then, the circuit equation is solved to calculate an output signal waveform 1205 of the instance 1200. A way of preparing the circuit equation is explained. An admittance for the input terminal capacitance of the wire 1202 and the instance 1201 is calculated, the wire 1202 is represented by an equivalent circuit whose response at the output terminal of the instance 1200 is equivalent, and a circuit equation is set up supposing that the instance 1200 drives the equivalent circuit. As the equivalent circuit, a π type RC circuit is used which comprises a resistor and capacitors connected to the terminals of the resistor, one of the capacitors being grounded.

Next, if the signal waveform 1205 is fed to the wire 1202, then the wire 1202 is represented by an equivalent circuit whose response at the output terminal of the wire 1202, i.e., at the input terminal of the instance 1201., is equivalent and a circuit equation at the foregoing output terminal is set up and then solved to calculate an input signal waveform 1206 of the instance 1201. Actually, the thus calculated signal waveforms 1205 and 1206 are nonlinear signal waveforms, different from the linear waveform as in FIG. 12(a), and are linearly approximated in correspondence with the input/output signal waveform correction table 203 and the dependence tables 500 and 501. In other words, nonlinear waveforms are used for actual calculation through the signal waveforms 1205 and 1206 are drawn in linear for easy correspondence with the input/output signal waveform correction table 203 and the dependence tables 500 and 501.

Figure 12B:
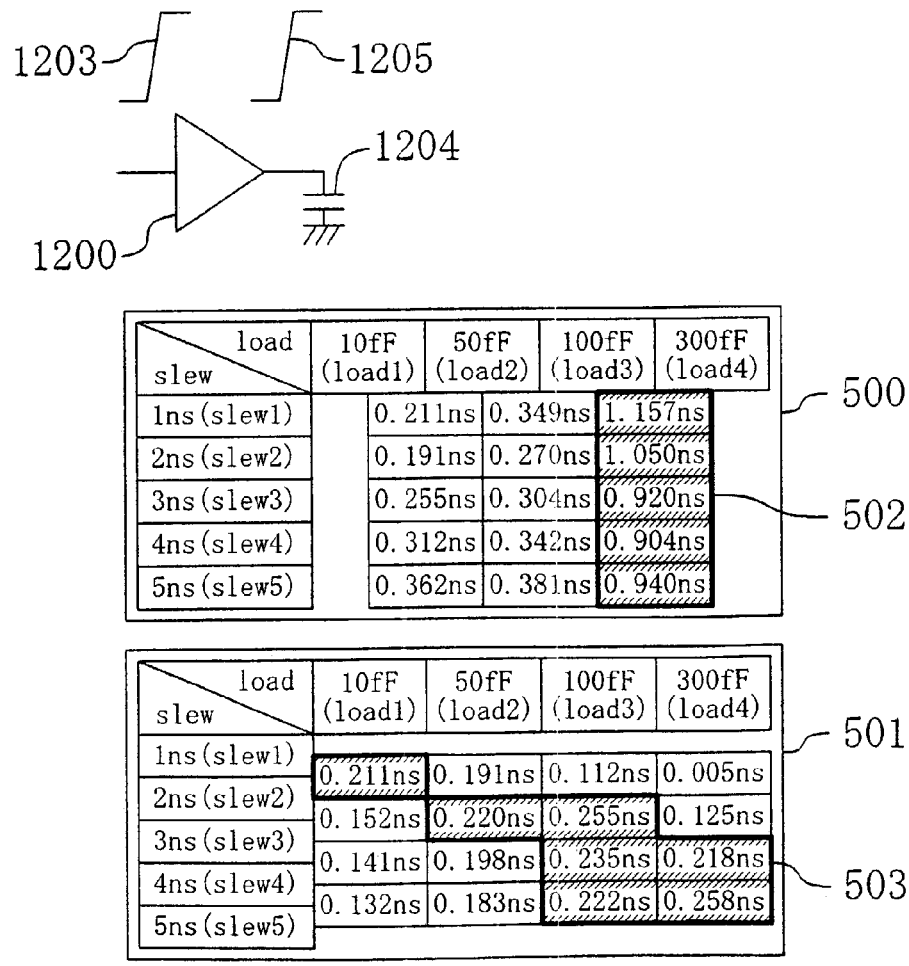

Calculation is carried out wherein the load capacitance of the instance 1200 and the input signal waveform of the instance 1201 serve as the input terminal information 1103. In FIG. 12, the input signal waveform of the instance 1200 is referenced to by the reference numeral 1203.

Thereafter, calculation is carried out for each set in the signal propagation direction and the input slew rate and the load capacitance of every instance are calculated. However, note that the input slew rate of an instance at the first of the signal propagation stages and the load capacitance of an instance of the last signal propagation stage are preassigned their respective default values.

Next, in an instance extraction step S1102, the input/output terminal information 1103 and the delay library 1100 are input, the input slew rate and the load capacitance written in the input/output terminal information 1103 are checked against the dependence table in the delay library 1100, and an instance operating in a region which is decided to be a high-dependence region is extracted as instance information 1104.

The dependence table of the instance 1200 is represented by tables 500 and 501.

The dependence decision technique decides to which one of the high- and low-dependence regions in each of the tables 500 and 501 the input slew rate and the load capacitance of the instance 1200 written in the input/output terminal information 1103 belong and if there is an instance that operates in the high-dependence region, then the instance is written in the instance information 1104.

Next, in a layout constraint generation step S1103 (a constraint step), the instance information 1104 and the delay library 1100 are input to generate a layout constraint 1105 so that either the timing of the instance of the net list 1101 or the timing of a path containing that instance can be modified.

In the first place, the dependence tables 500 and 501 of the instance 1200 written in the instance information 1104 are extracted from the delay library 1100.

Next, a concrete way of generating the layout constraint 1105 will be explained in which the input slew rate and the load capacitance of the instance 1200 written in the instance information 1104 are expressed as Tslew and as Cload, respectively.

The technique of generating the layout constraint 1105 will be explained using an exemplary case in which the input slew rate Tslew and the load capacitance Cload satisfy the following inequality expressions (3) and (4), respectively.

$$\text{slew2} < \text{Tslew} < \text{slew3} \quad (3)$$

$$\text{load3} < \text{Cload} < \text{load4} \quad (4)$$

First, Expression (4) and the table 500 are compared. The region, to which Expression (4) belongs, is independent on the input slew rate and therefore is always a high-dependence region, so that it is required to make the value of the load capacitance Cload smaller than that of the load capacitance load3.

Next, the table 501 and Expression (3) are compared. If the input slew rate Tslew satisfies Expression (3), then the region becomes a low-dependence region when the load capacitance value is as small as the load capacitance load1 or as great as the load capacitance load4.

From the above two points, it is sufficient that when the input slew rate Tslew is not changed at values expressed by Expression (3), the load capacitance Cload is made as great as the load1 to change the operation region of the instance 1200 to a low-dependence region.

Therefore, the layout constraint 1105 is described to include such a constraint that the load capacitance of the instance 1200 is made as small as the load1.

Another technique will be explained, in which Expression (4) and the table 500 are compared. Since the region, to which Expression (4) belongs, is independent on the input slew rate and therefore is always a high-dependence region, it is required to make the value of the load capacitance Cload smaller than that of the load capacitance load3. This is the same, until this stage, as the previously-mentioned technique.

Next, changing the input slew rate Tslew is taken into consideration. If the input slew rate Tslew is made to satisfy the following expression (5) from the table 501, this allows the magnitude of the load capacitance Cload to range between the load2 and load3 without having to set same as small as the load1 as in the foregoing technique.

$$\text{slew1} < \text{Tslew} < \text{slew2} \quad (5)$$

Accordingly, in this technique, as the layout constraint 1105, a constraint is described such that the load capacitance of the instance 1200 is changed from the load2 to about the load3 and, in addition, the input slew rate ranges between the slew1 and the slew2. More concretely, the constraint is given such that the drive power of an instance that drives the instance 1200 is increased and, in addition, the length of a wire that the instance 1200 drives is reduced.

In the way described above, layout constraints are generated to the instances written in the instance information 1104.

Next, if it is decided that there exists no longer an instance with the layout constraint 1105 in which nothing is written, i.e., if it is decided that there exists no high-dependence instance, the layout process is now completed.

On the other hand, if there is written some description in the layout constraint 1105, then the layout procedure is returned back to the layout step S1100. In the layout step S1100, according to the layout constraint 1105 a portion in point is subjected to relayout. Thereafter, the post-relayout dependence is decided. Such processing is repeatedly carried out until there exists no high-dependence instance.

A layout generated according to the above-described procedure is made up of only instances which operate in a region where the dependence of signal propagation delay between the instance input and output terminals is low, thereby enabling a delay calculation tool having an algorithm that does not deal with the signal waveform propagation between the instance input and output terminals to perform high-accuracy delay calculations. Because of this, at the time of back annotation, the margin corresponding to the delay calculation accuracy of a design margin used to guarantee the accuracy of the delay library and delay calculation for actual values, can be reduced. Further, the reliability of semiconductor integrated circuits can be improved.

As described above, according to the cell delay time calculation method of the present invention, the dependence of the output signal waveform of a cell upon the slew of the input signal waveform and the load capacitance of the cell is calculated, wherein a delay calculation tool having a high-accuracy delay calculation algorithm is applied to a portion which requires severe consideration for signal waveform propagation between the cell input and output terminals, to calculate delay times at high accuracy. On the other hand, a high-speed delay calculation tool is applied to a portion which does not require severe consideration for signal waveform propagation between the cell input and output terminals for delay time calculation. As a result of such arrangement, a high-speed, high-accuracy delay time calculation method is provided in the delay calculation of an entire LSI.

Further, in accordance with the semiconductor integrated circuit layout optimization method of the present invention, the dependence of the output signal waveform of a cell upon the slew of the input signal waveform and the load capacitance of the cell is calculated and layout is made such that the calculated dependence becomes lower than a predetermined dependence threshold level, whereby delay times can be calculated at high accuracy using only a delay calculation tool that does not deal with signal waveform propagation between the cell input and output terminals.

What is claimed is:

1. A semiconductor integrated circuit layout optimization method for optimally laying out a semiconductor integrated circuit formed of a plurality of cells connected by wires, said method comprising:

a layout step of (a) inputting a net: list and a delay library of said plurality of cells, (b) generating placement/wire routing information of said plurality of cells, and (c) generating RC information of parasitic elements of said placement/wire routing information;

an input/output terminal information extraction step of (a) inputting said RC information and said delay library and (b) calculating, for each cell of said plurality of cells, an input slew rate and a load capacitance that is connected to an output terminal of each said cell, for extracting input/output terminal information;

an instance extraction step of (a) inputting said input/output terminal information and said delay library, (b)

calculating, for each said cell, dependence of slew of an output signal waveform upon said input slew rate and said load capacitance, and (c) registering a cell whose dependence is higher than a predetermined dependence threshold level as instance information; and a constraint step of subjecting said cell registered as said instance information to re-layout so that the dependence of each said cell becomes lower than said predetermined dependence threshold level.

2. The semiconductor integrated circuit layout optimization method of claim 1, wherein said constraint step includes:

generating a layout constraint for use in cell re-layout of said cell registered in said instance information; and returning back to said layout step to perform said cell re-layout so as to meet said generated layout constraint.

* * * * *